US010073291B2

(12) United States Patent
Yang et al.

(10) Patent No.: US 10,073,291 B2
(45) Date of Patent: Sep. 11, 2018

(54) DISPLAY DEVICE

(71) Applicant: SAMSUNG DISPLAY CO., LTD., Yongin-si, Gyeonggi-do (KR)

(72) Inventors: Dong Ju Yang, Seoul (KR); Seul Ki Kim, Incheon (KR); Hyun Jung Lee, Dongducheon-si (KR); Hyo Jin Kim, Cheonan-si (KR); Kap Soo Yoon, Seoul (KR); Jeong Hyun Lee, Cheonan-si (KR); Yun Seok Han, Cheonan-si (KR); Jeong Uk Heo, Asan-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/234,201

(22) Filed: Aug. 11, 2016

(65) Prior Publication Data
US 2017/0184915 A1 Jun. 29, 2017

(30) Foreign Application Priority Data
Dec. 24, 2015 (KR) .......................... 10-2015-0186529

(51) Int. Cl.
*H01L 27/12* (2006.01)
*G02F 1/1335* (2006.01)
(Continued)

(52) U.S. Cl.
CPC ...... *G02F 1/133512* (2013.01); *G02F 1/1368* (2013.01); *G02F 1/13394* (2013.01); *G02F 1/133345* (2013.01); *G02F 1/134309* (2013.01); *G02F 1/136209* (2013.01); *G02F 1/136286* (2013.01); *H01L 27/124* (2013.01); *G02F 1/13439* (2013.01); *G02F 1/133514* (2013.01); *G02F 1/133553* (2013.01);
(Continued)

(58) Field of Classification Search
CPC ............ G02F 1/136286; G02F 1/1365; G02F 1/1368; G02F 1/133512; G02F 1/136209
See application file for complete search history.

(56) References Cited

U.S. PATENT DOCUMENTS

| 6,452,241 B1 * | 9/2002 | Fukata | G02F 1/136209 |
| | | | 257/350 |
| 2007/0210821 A1 * | 9/2007 | Park | G02B 1/10 |
| | | | 359/601 |

(Continued)

FOREIGN PATENT DOCUMENTS

KR   10-2014-0122619 A   10/2014

*Primary Examiner* — Julia Slutsker
(74) *Attorney, Agent, or Firm* — Lee & Morse, P.C.

(57) ABSTRACT

A display device is provided. The display device includes a first base substrate, a gate line on the first base substrate and extending in a first direction, a data line disposed on the first base substrate, insulated from the gate line, and extending in a second direction, which crosses the first direction, a switch on the first base substrate and electrically connected to the gate line and the data line, an insulating layer on the switch, a first electrode on the insulating layer, a light-shielding conductive layer directly contacting the first electrode and overlapping the switch, and a second electrode insulated from the first electrode and the light-shielding conductive layer, at least partially overlapping the first electrode, and electrically connected to the switch.

17 Claims, 33 Drawing Sheets

(51) Int. Cl.
*G02F 1/1333* (2006.01)
*G02F 1/1339* (2006.01)
*G02F 1/1343* (2006.01)
*G02F 1/1362* (2006.01)
*G02F 1/1368* (2006.01)
*G09G 3/36* (2006.01)

(52) U.S. Cl.
CPC ............ *G02F 2001/13398* (2013.01); *G02F 2001/134372* (2013.01); *G02F 2201/121* (2013.01); *G02F 2201/123* (2013.01); *G02F 2201/40* (2013.01); *G02F 2203/04* (2013.01); *G09G 3/3648* (2013.01); *G09G 3/3688* (2013.01); *G09G 3/3696* (2013.01); *G09G 2300/0426* (2013.01); *G09G 2310/08* (2013.01)

(56) References Cited

U.S. PATENT DOCUMENTS

| | | | |
|---|---|---|---|
| 2009/0051860 A1* | 2/2009 | Hiruma | G02B 5/003 349/106 |
| 2013/0113693 A1* | 5/2013 | Araki | G02F 1/134363 345/87 |
| 2014/0085582 A1* | 3/2014 | Chang | G02F 1/133707 349/138 |
| 2014/0111496 A1 | 4/2014 | Gomez et al. | |
| 2015/0055047 A1 | 2/2015 | Chang et al. | |
| 2015/0085215 A1* | 3/2015 | Yoshida | G02F 1/136213 349/39 |
| 2015/0228675 A1* | 8/2015 | Takanishi | G02F 1/133345 257/43 |
| 2015/0301389 A1* | 10/2015 | Yoshida | G02F 1/1345 257/43 |

* cited by examiner

DISPLAY DEVICE

CROSS-REFERENCE TO RELATED APPLICATION

Korean Patent Application No. 10-2015-0186529, filed on Dec. 24, 2015, in the Korean Intellectual Property Office, and entitled: "Display Device," is incorporated by reference herein in its entirety.

BACKGROUND

1. Field

The present disclosure relates to a display device.

2. Description of the Related Art

A liquid crystal display (LCD) device is one of the most widely-used flat panel displays. The LCD device includes two substrates, which include field-generating electrodes, e.g., pixel electrodes and a common electrode, having a gap therebetween, and a liquid crystal layer, which fills the gap between the two substrates. The LCD device generates an electric field in the liquid crystal layer by applying a voltage to the field-generating electrodes so as to determine the orientation of liquid crystal molecules in the liquid crystal layer, and controls the polarization of light incident thereupon, thereby displaying an image.

To prevent light leakage, a light-shielding member is provided in the LCD device. In a case in which the light-shielding member is formed on the opposite substrate to the substrate where the pixel electrodes are formed, light leakage may occur due to a misalignment of the two substrates, and the transmissivity and aperture ratio of a display region may decrease.

SUMMARY

According to an exemplary embodiment of the present disclosure, there is provided a display device. The display device includes a first base substrate, a gate line on the first base substrate and extending in a first direction, a data line on the first base substrate, insulated from the gate line, and extending in a second direction, which crosses the first direction, a switch on the first base substrate and electrically connected to the gate line and the data line, an insulating layer on the switch, a first electrode on the insulating layer, a light-shielding conductive layer directly contacting the first electrode and overlapping the switch, and a second electrode insulated from the first electrode and the light-shielding conductive layer, at least partially overlapping the first electrode, and electrically connected to the switch.

According to an exemplary embodiment of the present disclosure, there is provided a display device. The display device includes a first base substrate, a gate line on the first base substrate and extending in a first direction, a data line on the first base substrate, insulated from the gate line, and extending in a second direction, which crosses the first direction, a switch on the first base substrate and electrically connected to the gate line and the data line, an insulating layer on the switch, a first electrode on the insulating layer and electrically connected to the switch, a second electrode insulated from the first electrode and at least partially overlapping the first electrode, and a light-shielding conductive layer insulated from the first electrode, directly contacting the second electrode, and overlapping the switch.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
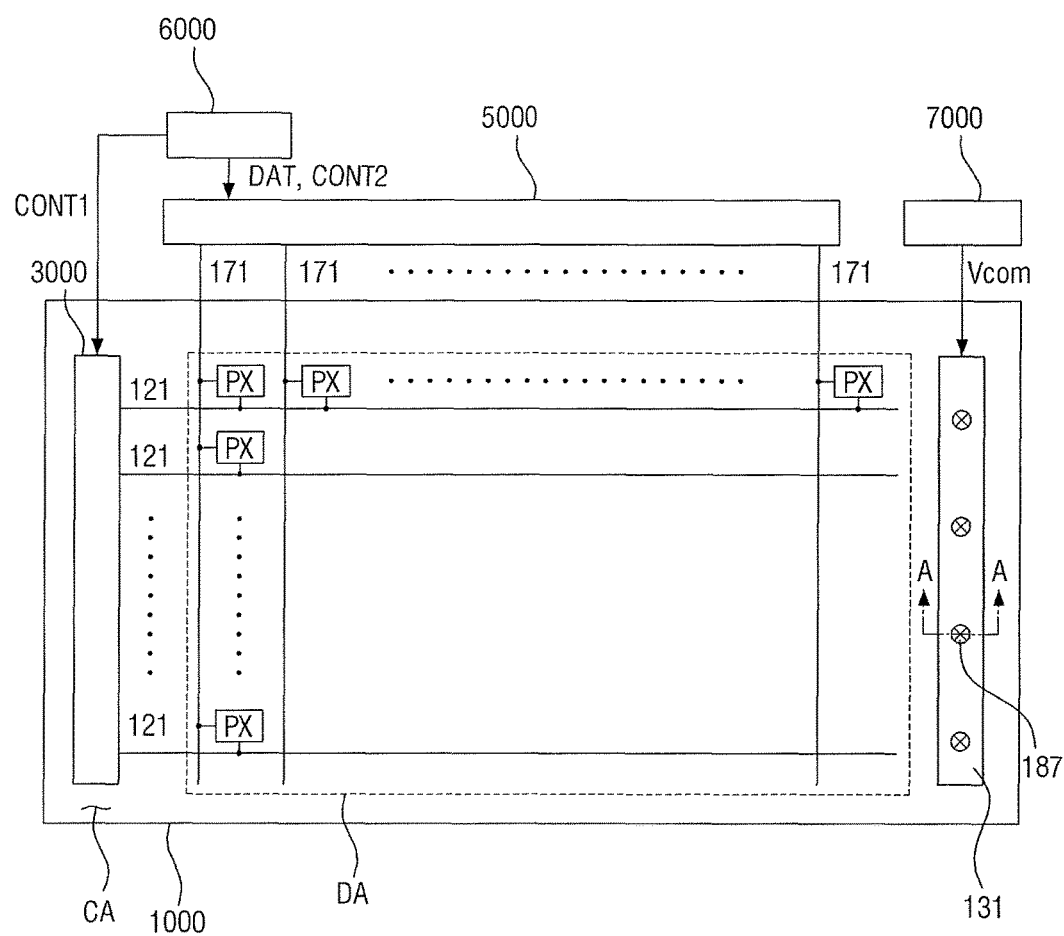
FIG. 1 illustrates a block diagram of a display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the drawings, identical or similar parts or elements are indicated by the same reference numerals.

Exemplary embodiments of the present disclosure will hereinafter be described with reference to the accompanying drawings.

FIG. 1 is a block diagram of a display device according to an exemplary embodiment of the present disclosure. Referring to FIG. 1, the display device according to the present exemplary embodiment may include a liquid crystal display (LCD) panel assembly 1000, a gate driver 3000, a data driver 5000, a signal controller 6000, and a common voltage generator 7000.

The LCD panel assembly 1000 may include a display area DA in which an image is displayed and a peripheral area CA in the periphery of the display area DA. The display area DA of the LCD panel assembly 1000 may include a plurality of signal lines (121 and 171) and a plurality of pixels PX connected to the plurality of signal lines (121 and 171) and arranged substantially in a matrix form.

The plurality of signal lines (121 and 171) may include a plurality of gate lines 121, which transmit gate signals, and a plurality of data lines 171, which transmit data voltages. The gate lines 121 may extend substantially in a first direction (for example, a horizontal direction) and may be almost in parallel to one another. The data lines 171 may transmit data voltages corresponding to image signals. The data lines 171 may extend substantially in a second direction (for example, a vertical direction) and may be almost in parallel to one another.

Each of the pixels PX may include at least one switching device connected to one of the gate lines 121 and one of the data lines 171, and at least one pixel electrode connected to the switching device. The switching device may be a tri-terminal device, e.g., a thin-film transistor (TFT), integrated onto the LCD panel assembly 1000. The switching device may be turned on or off by a gate signal applied thereto via the corresponding gate line 121 and may transmit a data voltage provided thereto via the data line 171 to the pixel electrode. The pixels PX may display an image according to the data voltages applied to their respective pixel electrodes.

The peripheral area CA may be part of a non-display area in which no image is displayed. The peripheral area CA may surround the display area DA or may be provided along the sides of the LCD panel assembly 1000.

The gate lines 121 and the data lines 171 from the display area DA may extend partially into, and may thus be partially located in, the peripheral area CA. A voltage line 131 for transmitting a common voltage Vcom to a common electrode in the display area DA may be in the peripheral area CA. FIG. 1 illustrates an example in which the voltage line 131 extends substantially in the vertical direction and is disposed on the opposite side of the gate driver 3000, but the present disclosure is not limited to this example. That is, the arrangement of the voltage line 131 may vary.

The common voltage generator 7000 may be electrically connected to the voltage line 131 of the LCD panel assembly 1000. The common voltage generator 7000 may generate the common voltage Vcom and may supply the common voltage Vcom to the voltage line 131. The common electrode in the display area DA may be electrically connected to the voltage line 131 and may, thus, be provided with the common voltage Vcom. In some exemplary embodiments, the common electrode may extend partially into the peripheral area CA and may, thus, be electrically and physically connected to the voltage line 131 via outer contact holes 187 in the peripheral area CA. In some exemplary embodiments, the common voltage generator 7000 may be integral with the data driver 5000 or the gate driver 3000.

The signal controller 6000 may control the data driver 5000 and the gate driver 3000. The signal controller 6000 receives input image signals and input control signals for controlling the display of the input image signals from an external graphic controller (not illustrated). The input control signals may include a vertical synchronization signal, a horizontal synchronization signal, a main clock signal, and a data enable signal. The signal controller 6000 may convert the input image signals into digital image signals DAT by appropriately processing the input image signals based on the input image signals and the input control signals, and may generate gate control signals CONT1 and data control signals CONT2. The gate control signals CONT1 may include a scanning start signal to initiate scanning, at least one clock signal for controlling the output period of a gate-on voltage Von, and at least one low voltage. The data control signals CONT2 include a horizontal synchronization start signal for initiating the transmission of the digital image signal DAT for a row of pixels PX, a load signal, and a data clock signal. The signal controller 6000 may transmit the data control signals CONT2, the gate control signals CONT1, and the digital image signals DAT to the gate driver 3000 and the data driver 5000.

The data driver 5000 is electrically connected to the data lines 171 of the LCD panel assembly 1000. The data driver 5000 receives the data control signals CONT2 and the digital image signals DAT from the signal controller 600, convert the digital image signals DAT into analog data signals by choosing gray voltages corresponding to the digital image signals DAT, and apply the analog data signals to the data lines 171. The gray voltages include gray voltages having a positive level with respect to the common voltage Vcom and gray voltages having a negative level with respect to the common voltage Vcom.

The data driver 5000 may be mounted in the peripheral area CA of the LCD panel assembly 1000 in the form of a plurality of integrated circuit (IC) chips, or may be mounted on a flexible printed circuit film and may then be mounted in the display device according to the present exemplary embodiment in the form of a tape carrier package (TCP), or may be mounted on a printed circuit board (PCB).

The gate driver 3000 is electrically connected to the gate lines 121. The gate driver 3000 generates the gate signals, including the gate-on voltage Von and a gate-off voltage Voff, according to the gate control signals CONT1 provided thereto from the signal controller 6000, and supplies the gate signals to the gate lines 121. The gate-on voltage Von is a voltage applied to the gate terminals of the TFTs of the pixels PX in the display area DA so as to turn on the TFTs of the pixels PX, and the gate-off voltage Voff is a voltage applied to the gate terminals of the TFTs of the pixels PX so as to turn off the TFTs of the pixels PX. In some exemplary embodiments, the gate driver 3000 may be integrated in the peripheral area CA of the LCD panel assembly 1000.

Figure 2:
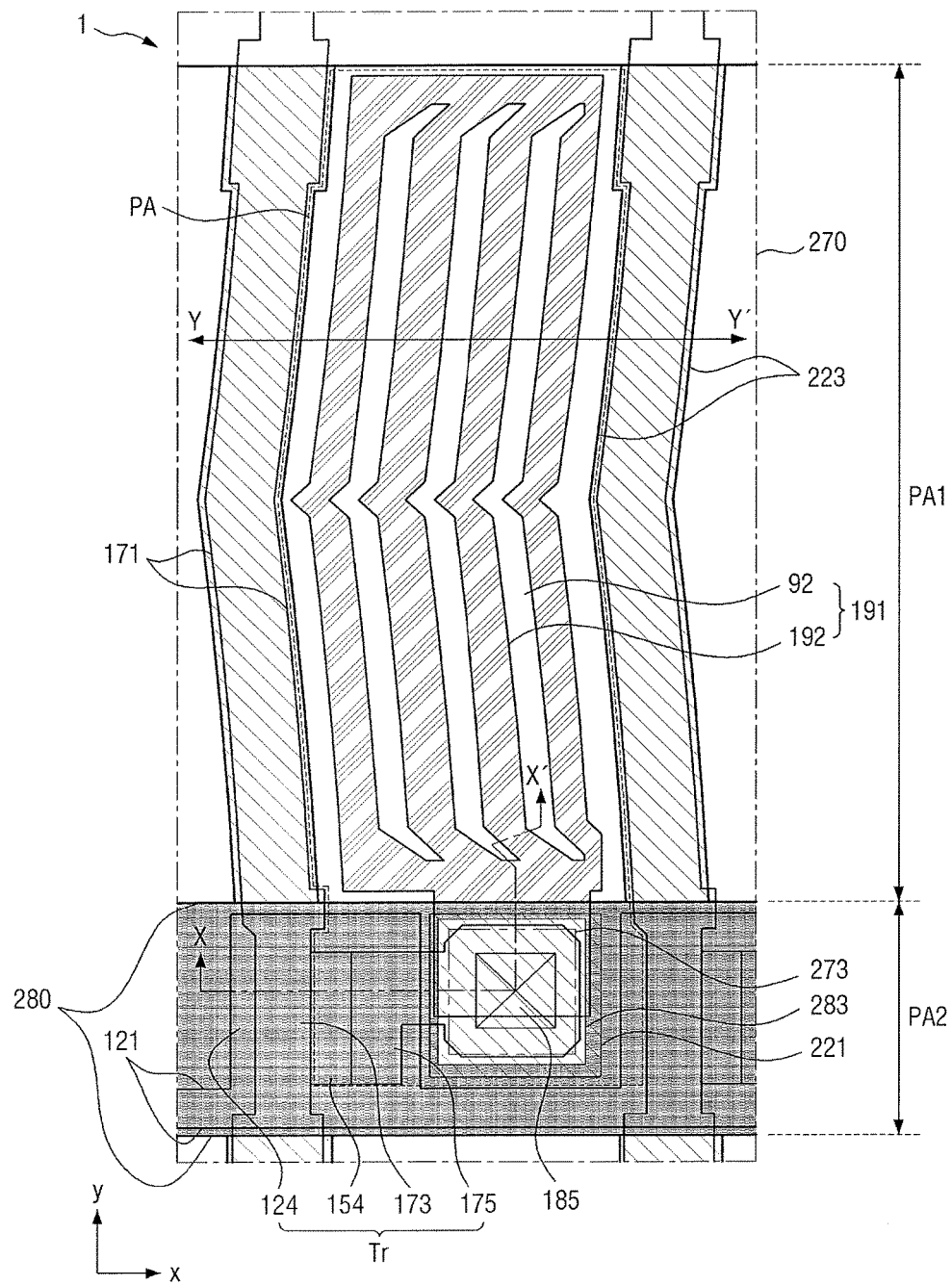
FIG. 2 illustrates a plan view of a pixel of the display device of FIG. 1.
Figure 3:
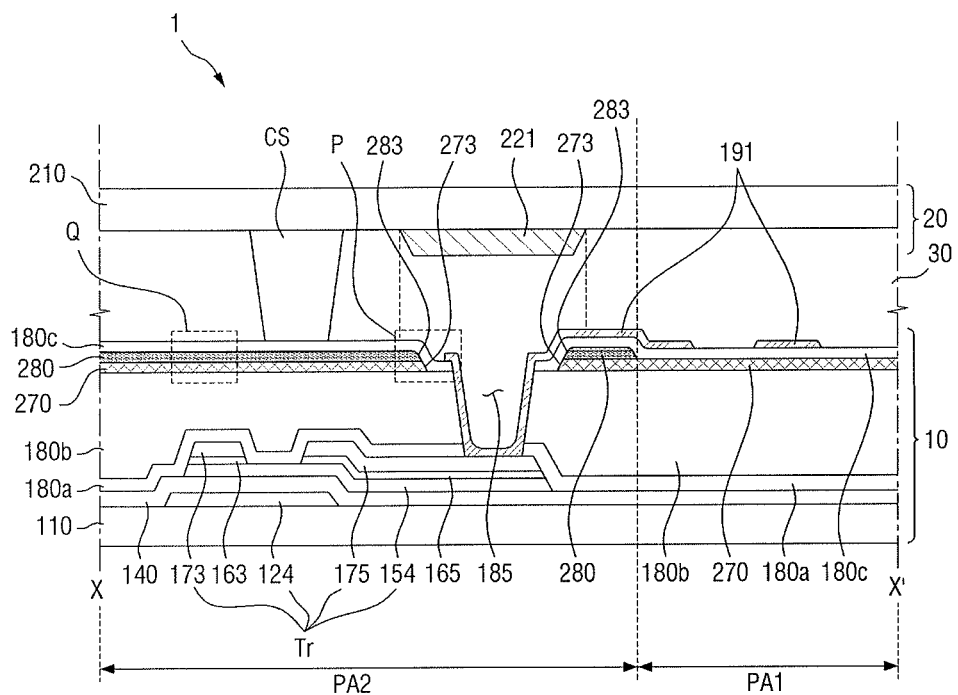
FIG. 3 illustrates a cross-sectional view taken along line X-X' of FIG. 2.
Figure 4:
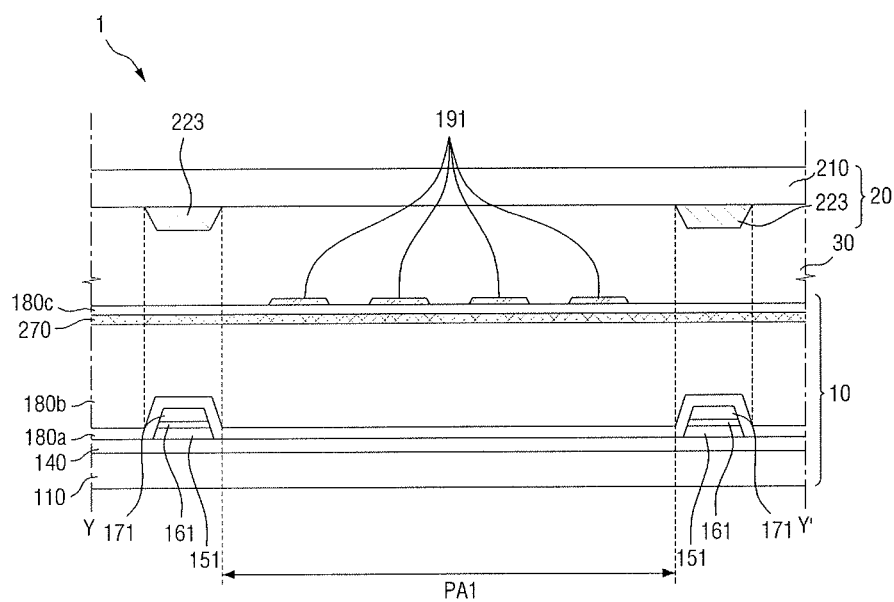
FIG. 4 illustrates a cross-sectional view taken along line Y-Y' of FIG. 2.

FIG. 2 is a plan view of a pixel of the display device of FIG. 1. FIG. 3 is a cross-sectional view taken along line X-X' of FIG. 2. FIG. 4 is a cross-sectional view taken along line Y-Y' of FIG. 2.

Referring to FIGS. 1 through 4, a display device 1 according to the exemplary embodiment of FIG. 1, and particularly, an LCD panel assembly of the display device 1, may include an array substrate 10, an opposite substrate 20, which faces the array substrate 10, and a liquid crystal layer 30 between the array substrate 10 and the opposite substrate 20. The display device 1 may also include a spacer member CS between the array substrate 10 and the opposite substrate 20.

The array substrate 10 may be a TFT array substrate on which switching devices such as, for example, TFTs, for driving a liquid crystal molecule in the liquid crystal layer 30 are formed. The opposite substrate 20 may be a substrate facing the array substrate 10.

The liquid crystal layer 30 may include a plurality of liquid crystal molecules having dielectric anisotropy. In response to an electric field being applied between the array substrate 10 and the opposite substrate 20, the liquid crystal molecules may be rotated between the array substrate 10 and the opposite substrate 20 in a predetermined direction, thereby allowing or blocking the transmission of light. The expression "rotation of the liquid crystal molecules", as used herein, not only means an actual rotation of the liquid crystal molecules, but also encompasses the change of the alignment of the liquid crystal molecules by the electric field.

The array substrate 10 will hereinafter be described. A first base substrate 110 may be an insulating substrate and may be transparent. For example, the first base substrate 110 may be a glass substrate, a quartz substrate, a transparent resin substrate, and so forth. The first base substrate 110 may include a polymer or plastic material with high thermal resistance. In some exemplary embodiments, the first base substrate 110 may have flexibility. That is, the first base substrate 110 may be a substrate that can be deformed through rolling, folding, bending, and so forth.

A gate line 121 and a gate electrode 124 may be on the first base substrate 110. The gate line 121 may transmit a gate signal and may extend substantially in a first direction (e.g., an x-axis direction). The gate electrode 124 may protrude from, and may be connected to, the gate line 121. The gate line 121 and the gate electrode 124 may be formed of an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chromium (Cr), tantalum (Ta), titanium (Ti), or the like. Each of the gate line 121 and the gate electrode 124 may have a single-layer structure or may have a multilayer structure including two conductive films having different physical properties. For example, one of the two conductive films may be formed of a low-resistance metal, e.g., an Al-based metal, an Ag-based metal, a Cu-based metal, or the like, so as to reduce signal delays or voltage drops in the gate wiring (GL and GE), and another conductive film may be formed of a material with excellent contact properties with respect to indium tin oxide (ITO) and indium zinc oxide (IZO), such as a Mo-based metal, Cr, Ti, Ta, or the like. Examples of the multilayer structure of each of the gate line 121 and the gate electrode 124 include the combination of a Cr lower film and an Al upper film and the combination of an Al lower film and a Mo upper film, but the present disclosure is not limited thereto. That is, the gate line 121 and the gate electrode 124 may be formed using various metals and conductors other than those set forth herein.

A gate insulating layer 140 may be on the gate line 121 and the gate electrode 124. The gate insulating layer 140 may be formed of an insulating material, for example, silicon nitride or silicon oxide. The gate insulating layer 140 may have a single-layer structure or may have a multilayer structure including two insulating films having different physical properties.

A semiconductor layer 154 may be on the gate insulating layer 140 and may partially overlap the gate electrode 124. The semiconductor layer 154 may include amorphous silicon, polycrystalline silicon, an oxide semiconductor, and so forth.

A plurality of ohmic contact members (163 and 165) may be on the semiconductor layer 154. The ohmic contact members (163 and 165) may include a source ohmic contact member 163 below a source electrode 173, described in detail later, and a drain ohmic contact member 165 below a drain electrode 175. The ohmic contact members (163 and 165) may be formed of n+ hydrogenated amorphous silicon doped with a high concentration of n-type impurities, or silicide.

The source electrode 173 may be on the source ohmic contact member 163, the drain electrode 175 may be on the drain ohmic contact member 165, and a data line 171 may be on the gate insulating layer 140.

The data line 171 may transmit a data voltage and may extend substantially in a second direction (for example, a y-axis direction), which crosses the first direction (e.g., the x-axis direction), to intersect the gate line 121. A pixel area PA may be defined at the intersection of the data line 171 and the gate line 121. The pixel area PA may be an area where each of the pixels PX of FIG. 1 is located. The pixel area PA includes a first pixel area PA1 in which a pixel electrode 191 is located and a second pixel area PA2 in which a TFT Tr that will be described later is located.

In some exemplary embodiments, the data line 171 may be periodically bent so as to improve the transmissivity of the display device 1. For example, the data line 171 may be bent into a V shape, as illustrated in FIG. 2, so as to maximize the transmissivity of the display device 1.

In some exemplary embodiments, semiconductor patterns 151 and data ohmic contact members 161 may be provided between the data line 171 and the gate insulating layer 140. Alternatively, the data ohmic contact members 161 may be disposed between the semiconductor patterns 151 and the data line 171. The semiconductor patterns 151 may include the same material as the semiconductor layer 154, and the data ohmic contact members 161 may include the same material as the source ohmic contact member 163 and the drain ohmic contact member 165.

In some exemplary embodiments, when the semiconductor layer 154 and the semiconductor patterns 151 are formed of an oxide semiconductor, the source ohmic contact member 163, the drain ohmic contact member 165, and the data ohmic contact members 161 may not be provided.

The source electrode 173 may be connected to the data line 171 and may overlap the gate electrode 124. In some exemplary embodiments, the source electrode 173 may be disposed on substantially the same line as the data line 171 without protruding from the data line 171, as illustrated in FIG. 2, but the present disclosure is not limited thereto. That is, the source electrode 173 may protrude from the data line 171 to the top of the gate electrode 124.

The drain electrode 175 may be isolated from the source electrode 173 over the gate electrode 124 and may be to face the source electrode 173. The drain electrode 175 may include a bar-shaped portion, which extends substantially in parallel to the source electrode 173, and an extended portion on the opposite side of the bar-shaped portion from the source electrode 173.

The data line 171, the source electrode 173, and the drain electrode 175 may be formed of Al, Cu, Ag, Mo, Cr, Ti, Ta, or an alloy thereof and may each have a multilayer structure including a lower film formed of a refractory metal and a low-resistance upper film formed on the lower film, but the present disclosure is not limited thereto. That is, the data line 171, the source electrode 173, and the drain electrode 175 may be formed using various metals and conductors other than those set forth herein.

The gate electrode 124, the source electrode 173, and the drain electrode 175 may form a switching device, for example, the TFT Tr, together with the semiconductor layer 154. The TFT Tr may be provided in the second pixel area PA2 of the pixel area PA.

A first passivation layer 180a may be on the gate insulating layer 140, the semiconductor layer 154, the source electrode 173, and the drain electrode 175. The first passivation layer 180a may include an organic insulating material or an inorganic insulating material, e.g., silicon oxide, silicon nitride, silicon oxynitride, and so forth. The first passivation layer 180a may protect the TFT Tr and may prevent a material included in an insulating layer 180b from infiltrating into the semiconductor layer 154.

The insulating layer 180b may be on the first passivation layer 180a. In some exemplary embodiments, the insulating layer 180b may serve to planarize the top of the first passivation layer 180a. The insulating layer 180b may be an organic layer. In some exemplary embodiment, the insulating layer 180b may include a photosensitive organic insulating material.

In some exemplary embodiments, the insulating layer 180b may further include a color pigment. For example, the insulating layer 180b may include a color pigment capable of allowing the transmission of light of a particular color wavelength therethrough. That is, the insulating layer 180b may include a plurality of color filters. For example, the color filters may transmit, but are not limited to, one of primary colors such as red, green, and blue. Alternatively, the color filters may transmit one of cyan, magenta, yellow, and white (or a whitish color). However, the present disclosure is not limited to these exemplary embodiments. That is, the insulating layer 180b may not include any color pigment. In other exemplary embodiments, color filters may be additionally provided at the array substrate 10 or the opposite substrate 20.

A first electrode 270 may be on the insulating layer 180b. In some exemplary embodiments, the first electrode 270 may be a common electrode. The first electrode 270 may have a planar shape, may be on the first base substrate 110 as a plate, and may be provided with the common voltage Vcom, which is of a predetermined magnitude. The first electrode 270 may include a first opening 273 in an area corresponding to part of the drain electrodes 175. In some exemplary embodiments, the first electrode 270 may be formed of a transparent conductive material, e.g., ITO, IZO, indium tin zinc oxide (ITZO), or aluminum-doped zinc oxide (AZO).

A light-shielding conductive layer 280 may be on the first electrode 270. The light-shielding conductive layer 280 may be formed along the first direction (e.g., the x-axis direction) in which the gate line 121 extends. The light-shielding conductive layer 280 may be located in the second pixel area PA2 of the pixel area PA, but may not be provided in the first pixel area PA1. The light-shielding conductive layer 280 may overlap the TFT Tr and may also overlap the gate line 121. The light-shielding conductive layer 280 may prevent the transmission of light incident thereupon and may also prevent the TFT Tr or the gate line 121 from becoming visible from outside the display device 1.

The light-shielding conductive layer 280 may include a second opening 283 in an area corresponding to part of the drain electrode 175. The second opening 283 may overlap the first opening 273 in a plan view. The relationship between the first electrode 270 and the light-shielding conductive layer 280 will hereinafter be described with reference to FIGS. 5 and 6.

Figure 5:
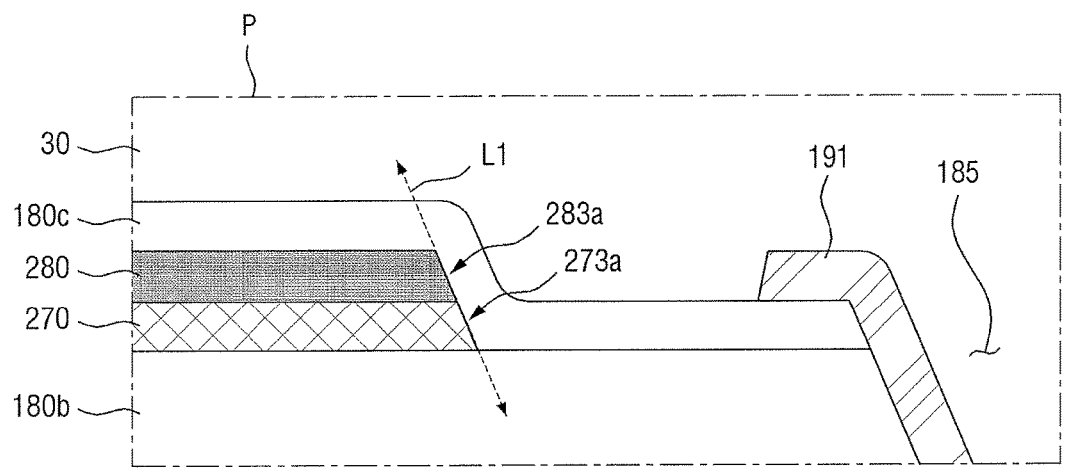
FIG. 5 illustrates an enlarged cross-sectional view of an example of a portion P of FIG. 3.
Figure 6:
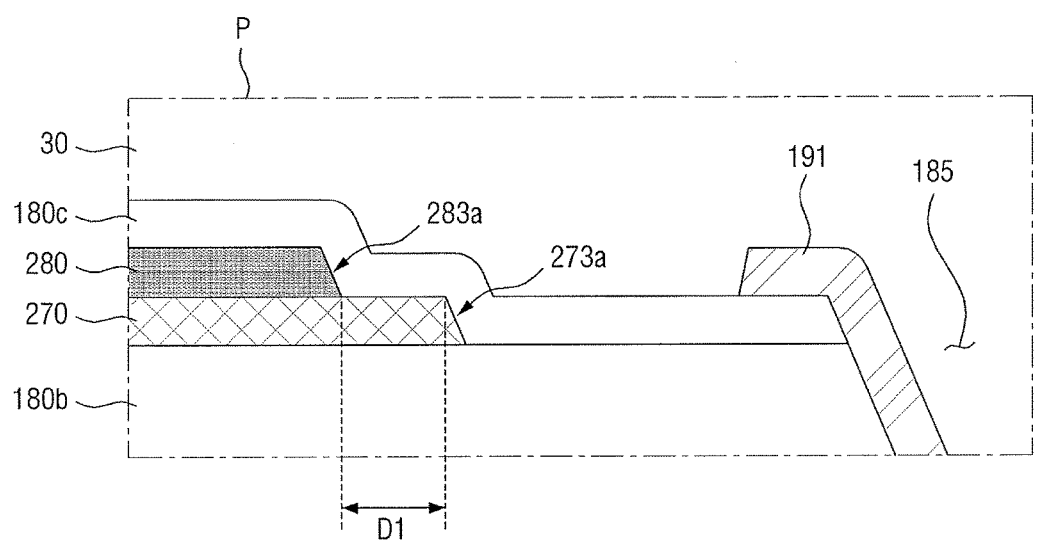
FIG. 6 illustrates an enlarged cross-sectional view of another example of the portion P of FIG. 3.

FIG. 5 is an enlarged cross-sectional view of an example of a portion P of FIG. 3. FIG. 6 is an enlarged cross-sectional view of another example of the portion P of FIG. 3.

Referring to FIGS. 3, 5, and 6, in some exemplary embodiments, a first opening inner side 273a of the first electrode 270 and a second opening inner side 283a of the light-shielding conductive layer 280 may be disposed substantially on the same straight line, i.e., a straight line L1. For example, the first opening 273 of the first electrode 270 and the second opening 283 of the light-shielding conductive layer 280 may be formed by wet-etching the first electrode 270 and the light-shielding conductive layer 280 using the same etching mask. Thus, the first opening inner side 273a of the first electrode 270 and the second opening inner side 283a of the light-shielding conductive layer 280 may both be disposed the straight line L1. In other words, the first opening 273 of the first electrode 270 and the second opening 283 of the light-shielding conductive layer 280 may share the same etched surface. The expression "two or more elements sharing the same etching surface", as used herein, means that the two or more elements are etched together so that their etched surfaces are continuously connected to each other.

Alternatively, referring to FIGS. 2, 3, and 6, the first opening inner side 273a of the first electrode 270 and the second opening inner side 283a of the light-shielding conductive layer 280 may not be disposed on the same straight line. For example, the second opening inner side 283a may be further apart than the first opening inner side 273a to the contact hole 185. A minimum distance D1 between the first opening inner side 273a and the second opening inner side 283a may be between 0 μm to 0.3 μm. The first opening 273 of the first electrode 270 and the second opening 283 of the light-shielding conductive layer 280 may be formed by etching the first electrode 270 and the light-shielding conductive layer 280 using the same etching mask. When the first electrode 270 and the light-shielding conductive layer 280 are wet-etched using the same etching mask, the light-shielding conductive layer 280 may be etched first, thereby forming the second opening 283, and then, the first electrode 270 may be etched, thereby forming the first opening 273. Since the second opening 283 may be exposed to an etchant for a relatively longer period of time than the first opening 273 and may thus be etched more than necessary during the formation of the first opening 273. As a result, the first opening inner side 273a may be closer than the second opening inner side 283a to the contact hole 185.

Referring back to FIGS. 1 through 4, in some exemplary embodiments, the light-shielding conductive layer 280 may be formed of a conductor having light-shielding properties, for example, an opaque metal. For example, the opaque metal may be a low-resistance metal such as an Al-based metal, a Mo-based metal, a Ti-based metal, an Ag-based metal, or a Cu-based metal. In some exemplary embodiments, the light-shielding conductive layer 280 may have a thickness of 500 Å to 1000 Å to secure light-shielding properties.

Alternatively, in some other exemplary embodiments, the light-shielding conductive layer 280 may be formed as a concentration gradient layer having a concentration gradient of a transparent conductive material and an opaque metal having light-shielding properties. For example, the opaque metal may be a low-resistance metal such as an Al-based metal, a Mo-based metal, a Ti-based metal, an Ag-based metal, or a Cu-based metal, and the transparent conductive material may be ITO, IZO, zinc oxide (ZnO), indium oxide (TO), tin oxide (TO), ITZO, or AZO. The refractive index of the concentration gradient layer may continue to vary due to continuous variations in the concentration of the opaque metal and the transparent conductive material. In some exemplary embodiments, the light-shielding conductive layer 280 may have an optical density of 4 or higher and may thus be able to absorb light incident thereupon without reflecting the incident light. The contents of the opaque metal and the transparent conductive material in the light-shielding conductive layer 280 may continue to vary depending on the depth of the light-shielding conductive layer 280 or along a thickness direction of the light-shielding conductive layer 280. The term "thickness direction", as used herein, may denote a direction perpendicular to the surface of the light-shielding conductive layer 280, e.g., along the z-axis.

Figure 7:
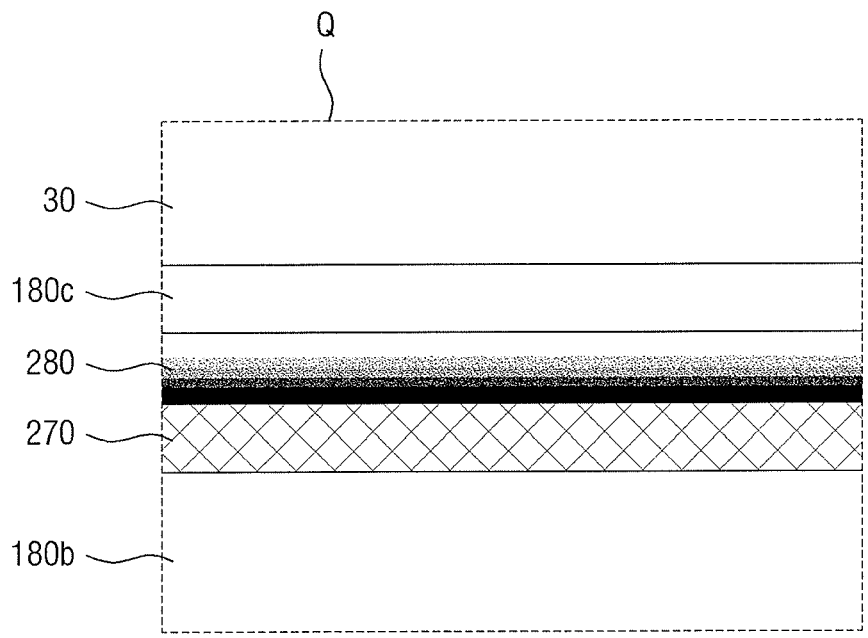
FIG. 7 illustrates an enlarged cross-sectional view of a portion Q of FIG. 3 for explaining an example of a light-shielding conductive layer of FIG. 3.
Figure 8:
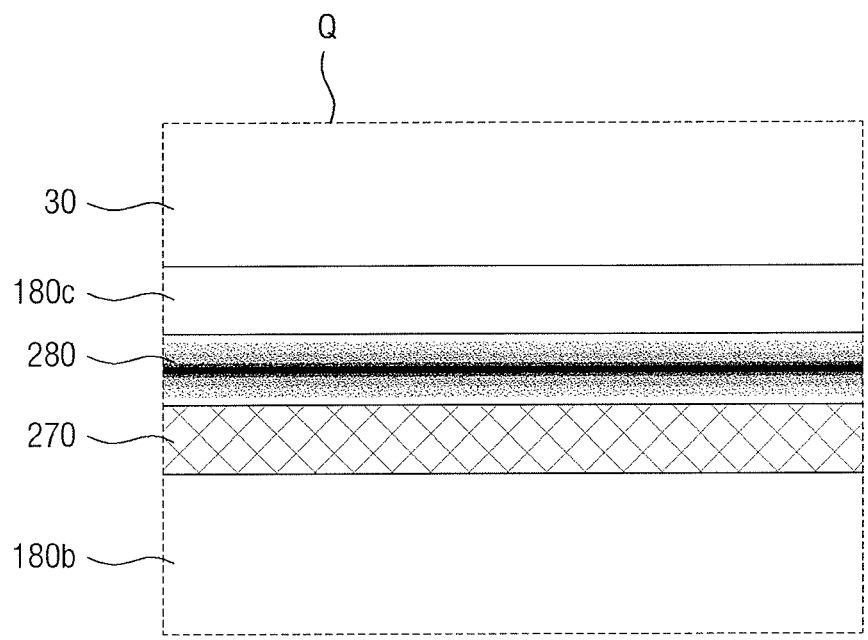
FIG. 8 illustrates an enlarged cross-sectional view of the portion Q of FIG. 3 for explaining another example of the light-shielding conductive layer of FIG. 3.

Examples of the light-shielding conductive layer 280 as a concentration gradient layer will hereinafter be described with reference to FIGS. 7 and 8. FIG. 7 is an enlarged cross-sectional view of a portion Q of FIG. 3 for explaining an example of the light-shielding conductive layer 280 of FIG. 3. FIG. 8 is an enlarged cross-sectional view of the portion Q of FIG. 3 for explaining another example of the light-shielding conductive layer 280 of FIG. 3.

Referring to FIGS. 2, 3, and 7, the content of the transparent conductive material in the light-shielding conductive layer 280 may gradually increase closer to the opposite substrate 20 and the content of the opaque metal in the light-shielding conductive layer 280 may gradually increase closer to the first base substrate 110.

Alternatively, referring to FIGS. 2, 3, and 8, the content of the opaque metal in the light-shielding conductive layer 280 may gradually increase closer to the center of the light-shielding conductive layer 280 and the content of the transparent conductive material in the light-shielding conductive layer 280 may gradually increase closer to both surfaces, i.e., a periphery along the z-axis, of the light-shielding conductive layer 280. The contents may be the same along the x-y plane, while changing along the z-axis.

The concentration gradient of the opaque metal and the transparent conductive material in the light-shielding conductive layer 280 is not limited to the examples of FIGS. 7 and 8, but may vary.

In some exemplary embodiments, the light-shielding conductive layer 280 may have a multilayer structure. An exemplary light-shielding conductive layer 280 having a multilayer structure will hereinafter be described with reference to FIG. 9.

Figure 9:
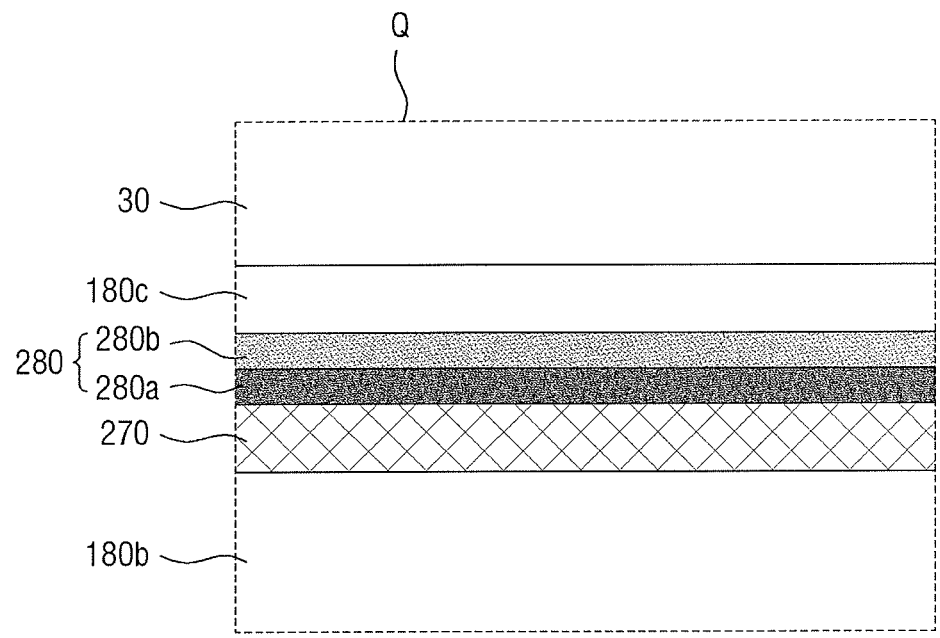
FIG. 9 illustrates an enlarged cross-sectional view of the portion Q of FIG. 3 for explaining another example of the light-shielding conductive layer of FIG. 3.

FIG. 9 is an enlarged cross-sectional view of the portion Q of FIG. 3 for explaining another example of the light-shielding conductive layer 280 of FIG. 3. Referring to FIGS. 2, 3, and 9, in some exemplary embodiments, the light-shielding conductive layer 280 may include a light-shielding metal layer 280a and a low-reflection layer 280b.

The light-shielding metal layer 280a may be on the first electrode 270 and may directly contact the first electrode 270. The light-shielding metal layer 280a may be formed of a conductor having light-shielding properties, e.g., an opaque metal. For example, the opaque metal may be a low-resistance metal, e.g., an Al-based metal, a Mo-based metal, a Ti-based metal, an Ag-based metal, a Cu-based metal, and so forth. In some exemplary embodiments, the light-shielding metal layer 280a may have a thickness of 500 Å to 1000 Å to secure light-shielding properties.

The low-reflection layer 280b may be on the light-shielding metal layer 280a. In some exemplary embodiments, the low-reflection layer 280b may directly contact the light-shielding metal layer 280a and may be between the light-shielding metal layer 280a and a second passivation layer 180c. The low-reflection layer 280b may prevent the reflection of light by the light-shielding metal layer 280a and may lower the optical reflectance of the light-shielding conductive layer 280. Accordingly, a decrease in contrast ratio that may occur in the array substrate 10 due to the reflection of light may be reduced or prevented.

In some exemplary embodiments, the low-reflection layer 280b may include a conductive material, and the conductive material may be a transparent conductive material. For example, the transparent conductive material may be at least one of IZO, ZnO, gallium zinc oxide (GZO), zinc indium oxide (ZIO), and Al-doped zinc oxide (ZAO). In some exemplary embodiments, the low-reflection layer 280b may have a thickness of 400 Å to 1000 Å, but the present disclosure is not limited thereto. That is, in other exemplary embodiments, the low-reflection layer 280b may include at least one selected from a low-reflection metal group consisting of copper nitride (CuNx), molybdenum oxide (MoX), and molybdenum titanium.

FIG. 9 illustrates an example in which the light-shielding conductive layer 280 has a double-layer structure, but the present disclosure is not limited to this example. In some exemplary embodiments, the light-shielding conductive layer 280 may have a multilayer structure consisting of three or more layers.

Referring back to FIGS. 2 through 4, the light-shielding conductive layer 280 may be directly on the first electrode 270 and may directly contact the first electrode 270. That is, the light-shielding conductive layer 280 may be physically and electrically connected to the first electrode 270. When the first electrode 270 is formed of a transparent conductive material such as ITO or IZO, large RC delays may be generated due to the intrinsic resistance of the transparent conductive material. However, since the light-shielding conductive layer 280 directly contacts the first electrode 270, the light-shielding conductive layer 280 may lower the resistance of the first electrode 270 and may thus reduce or eliminate RC delays.

The second passivation layer 180c may be on the first electrode 270 and the light-shielding conductive layer 280. The second passivation layer 180c may include an inorganic insulating material such as silicon oxide, silicon nitride, silicon oxynitride, and so forth. The second passivation layer 180c may prevent or restrain the insulating layer 180b from being lifted off from the underlying layers and may suppress or eliminate the contamination of the liquid crystal layer 30 by an organic material, such as a solvent from the insulating layer 180b, thereby reducing or preventing defects such as afterimages that may occur during the driving of the display device 1.

The contact hole 185, which exposes the drain electrode 175, may be formed through the first passivation layer 180a, the insulating layer 180b, and the second passivation layer 180c. The contact hole 185 may be on an inner side of the first opening 273 of the first electrode 270 and the second opening 283 of the light-shielding conductive layer 280. That is, the first opening 273 of the first electrode 270 and the second opening 283 of the light-shielding conductive layer 280 may surround the contact hole 185.

A second electrode 191 may be on the second passivation layer 180c, and may be located in the first pixel area PA1 of the pixel area PA. In some exemplary embodiments, the second electrode 191 may be a pixel electrode. The second electrode 191 may at least partially overlap the first electrode 270. The second electrode 191 may include a plurality of branch electrodes 192, which overlap the first electrode 270, and slits 92 formed among the branch electrodes 192.

In some exemplary embodiments, the branch electrodes 192 of the second electrode 191 may extend substantially in parallel to the data line 171, e.g., may follow an outline of the data line 171. For example, when the data line 171 is curved, each of the branch electrodes 192 may be formed to have a curved edge.

The second electrode 191 may partially extend into the second pixel area PA2 and may thus be electrically and physically connected to the drain electrode 175 via the contact hole 185. As a result, the second electrode 191 may receive a voltage from the drain electrode 175. The second electrode 191 may be formed of a transparent conductive material such as ITO, IZO, ITZO, or AZO.

Although not specifically illustrated, an alignment layer may be on the second electrode 191 and on the second passivation layer 180c. The alignment layer may be a horizontal alignment layer and may have a uniform rubbing direction, but the present disclosure is not limited thereto. That is, the alignment layer may include a photoreactive material and may be optically aligned.

The opposite substrate 20 will hereinafter be described. The opposite substrate 20 may include a second base substrate 210 and a light-shielding member 221, and may also include an auxiliary light-shielding member 223.

The second base substrate 210, like the first base substrate 110, may be a transparent insulating substrate. The second base substrate 210 may include a polymer or plastic material with high thermal resistance. In some exemplary embodiments, the second base substrate 210 may have flexibility.

The light-shielding member 221 may be on a first surface of the second base substrate 210 that faces the first base substrate 110. The light-shielding member 221 may overlap the contact hole 185 and may thus prevent or reduce light leakage in an area around the contact hole 185. In some exemplary embodiments, the light-shielding member 221 may be formed into the pattern of an island. The light-shielding member 221 may overlap part of the area around the contact hole 185 that is not covered by the light-shielding conductive layer 280. In other words, the light-shielding member 221 may completely cover the second opening 283 of the light-shielding conductive layer 280 in a plan view, as will be described later in detail.

The light-shielding member 221 may include a light-shielding pigment, e.g. black carbon or an opaque material to visible light, e.g., Cr, a photosensitive organic material, and so forth.

In some exemplary embodiments, the auxiliary light-shielding member 223 may be additionally provided on the first surface of the second base substrate 210. The auxiliary light-shielding member 223 may be formed along a direction in which the data line 171 extends and may overlap the data line 171. The auxiliary light-shielding member 223 may completely cover the data line 171 in a plan view. The auxiliary light-shielding member 223, like the light-shielding member 221, may include a light-shielding pigment, e.g., black carbon or an opaque material such as Cr, a photosensitive organic material, and so forth. In some exemplary embodiments, the auxiliary light-shielding member 223 may be formed of the same material as the light-shielding member 221.

The spacer member CS maintains the gap between the array substrate 10 and the opposite substrate 20, which face each other. The spacer member CS may be on the first surface of the second base substrate 210 and may protrude toward the array substrate 10 along the a-axis. In some exemplary embodiments, the spacer member CS may be formed of an organic insulating material and may have photosensitivity.

In some exemplary embodiments, the spacer member CS may include a light-shielding pigment and may be formed of the same material as the light-shielding member 221, in which case, the spacer member CS and the light-shielding member 221 may be formed at the same time using a single optical mask. The optical mask may include a light-transmitting area which transmits light therethrough, a non-light-transmitting area which blocks the transmission of light, and a halftone area which transmits only some light therethrough, and the halftone area may correspond to the light-shielding member 221. However, the present disclosure is not limited to these exemplary embodiments. That is, in other exemplary embodiments, the spacer member CS may be formed of a transparent insulating material. To improve an aperture ratio, the spacer member CS may overlap the TFT Tr.

Although not specifically illustrated, an alignment layer may be on the first surface of the second base substrate 210, on the spacer member CS, and on the light-shielding member 221. The alignment layer may be a horizontal alignment layer and may have a uniform rubbing direction, but the present disclosure is not limited thereto. That is, the alignment layer may include a photoreactive material and may be optically aligned.

Figure 10:
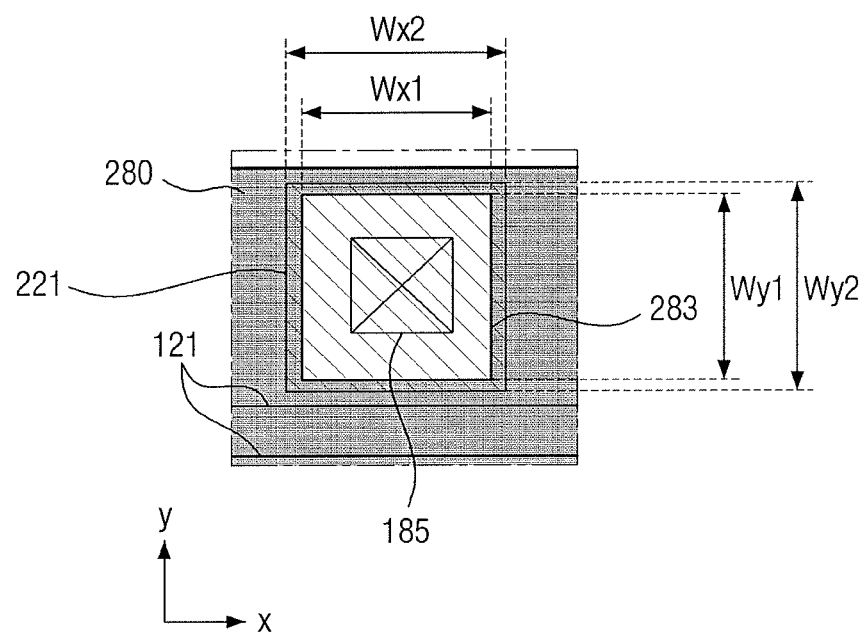
FIG. 10 illustrates a partial enlarged plan view of the display device of FIG. 2.

FIG. 10 is a partial enlarged plan view of the display device of FIG. 2. More specifically, FIG. 10 is a schematic plan view illustrating the arrangement of the light-shielding conductive layer 280 and the light-shielding member 221 in, and around, the contact hole 280 of FIG. 2.

Referring to FIG. 10, the light-shielding conductive layer 280 may completely cover the gate line 121, in a plan view, along the first direction (e.g., the x-axis direction) and the second direction (e.g., the y-axis direction).

The second opening 283 of the light-shielding conductive layer 280 may be disposed to surround the contact hole 185. In other words, the contact hole 185 may be disposed inside the second opening 283 in a plan view.

In a plan view, the light-shielding member 21 may overlap the contact hole 185 and the second opening 283 of the light-shielding member 280, and may completely cover the second opening 283 of the light-shielding conductive layer 280. For example, in a plan view, a maximum width Wx1, in the first direction (e.g., the x-axis direction), of the second opening 283 may be smaller than, or the same as, a maximum width Wx2, in the first direction (e.g., the x-axis direction), of the light-shielding member 221, and a maximum width Wy1, in the second direction (e.g., the y-axis direction), of the second opening 283 may be smaller than, or the same as, a maximum width Wy2, in the second direction (e.g., the y-axis direction), of the light-shielding member 221. In other words, in a plan view, the sides of the light-shielding member 221 may be located outside the inner sides of the second opening 283. Accordingly, the light-shielding member 221 may prevent or reduce light leakage not only in the area around the contact hole 185, but also in an area around the second opening 283.

Figure 11:
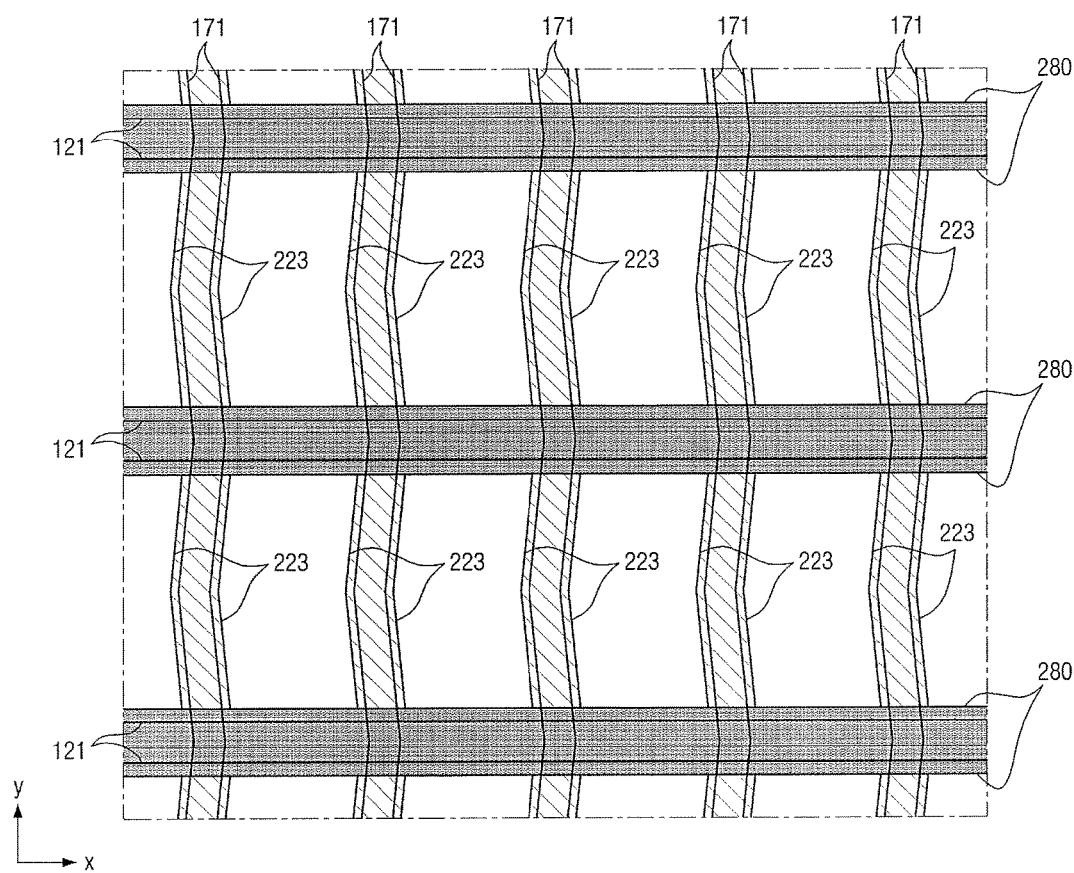
FIG. 11 illustrates a schematic plan view of the arrangement of data lines, gate lines, light-shielding conductive layers, and auxiliary light-shielding members in a plurality of pixel areas of the display device of FIGS. 3 and 4.

FIG. 11 is a schematic plan view illustrating the arrangement of data lines, gate lines, light-shielding conductive layers, and auxiliary light-shielding members in a plurality of pixel areas of the display device of FIG. 3 or 4. For convenience, a second opening formed in the light-shielding conductive layer is not illustrated in FIG. 11.

Referring to FIG. 11, in a plan view, light-shielding conductive layers 280, like gate lines 121, may extend in the first direction (e.g., the x-axis direction), and may overlap and cover the gate lines 121. In a plan view, auxiliary light-shielding members 223, like data lines 171, may extend in the second direction (e.g., the y-axis direction), and may overlap and cover the data lines 171.

The auxiliary light-shielding members 223, which are adjacent to one another in the second direction (e.g., the y-axis direction), may be spaced from one another with the light-shielding conductive layers 280 interposed thereamong. For example, the auxiliary light-shielding members 223 may not overlap the gate lines 121. The auxiliary light-shielding members 223 may not overlap at all, or may only partially overlap, the light-shielding conductive layers 280, which cover the gate lines 121.

The arrangement of the light-shielding conductive layers 280 and the auxiliary light-shielding members 223 is not limited to that illustrated in FIG. 11, but may vary.

Figure 12:
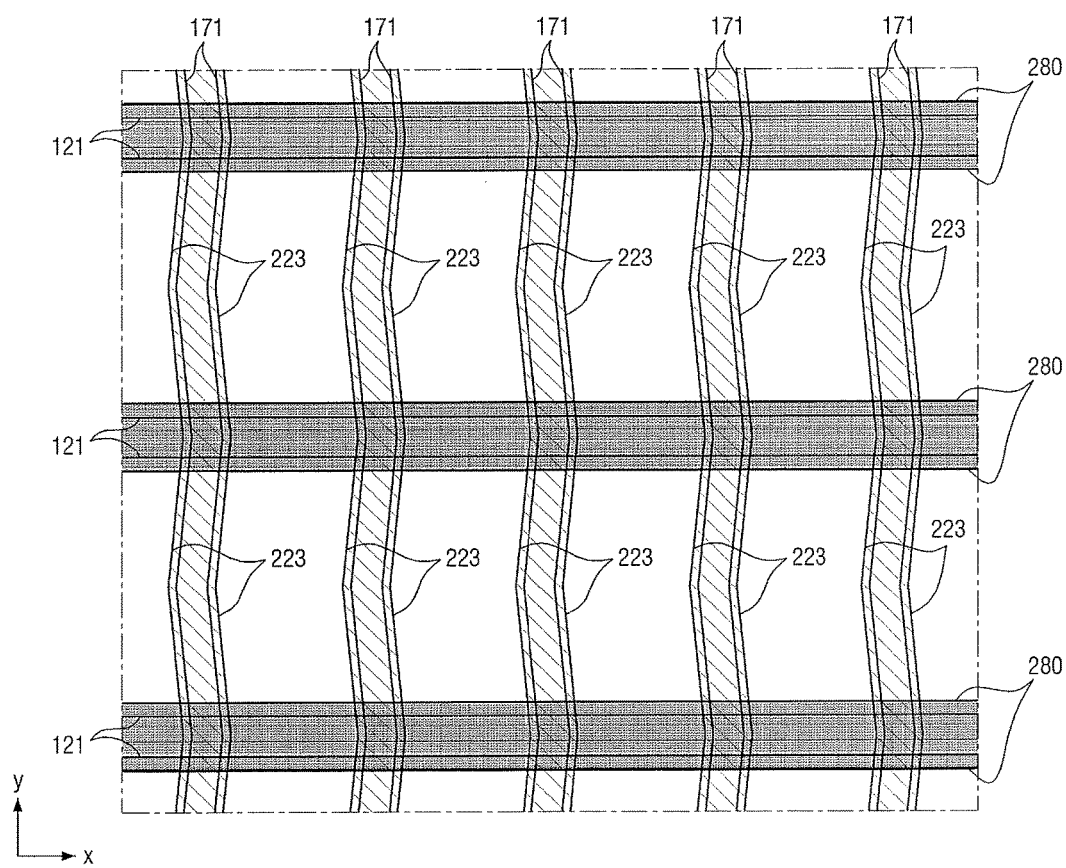
FIG. 12 illustrates a plan view of a modified example of FIG. 11.

FIG. 12 is a plan view of a modified example of FIG. 11. Referring to FIG. 12, light-shielding conductive layers 280, like their counterpart of FIG. 11, may extend in the first direction (e.g., the x-axis direction) and may cover gate lines 121, and auxiliary light-shielding members 223, unlike their counterpart of FIG. 11, may extend in the second direction (e.g., the y-axis direction) without discontinuity and may partially overlap the gate lines 121 and the light-shielding conductive layers 280.

Figure 13:
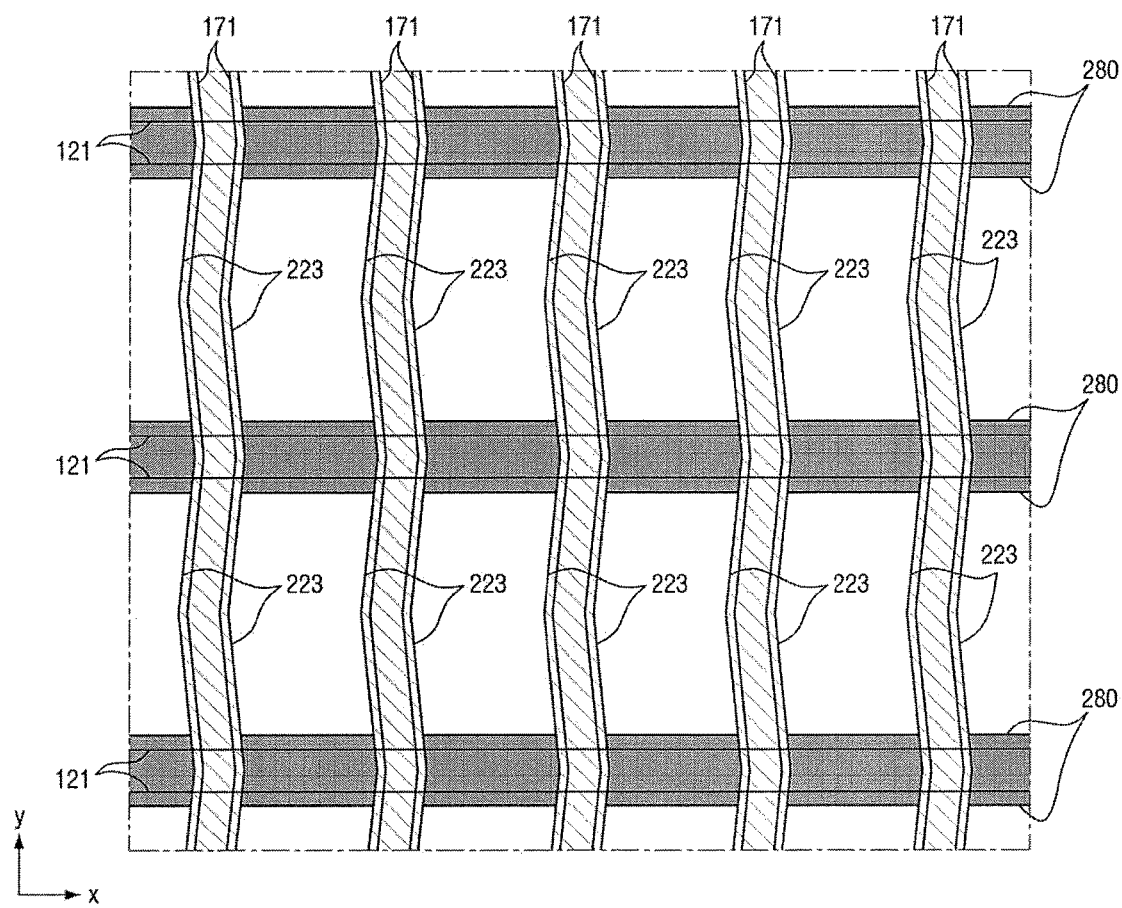
FIG. 13 illustrates a plan view of another modified example of FIG. 11.

FIG. 13 is a plan view of another modified example of FIG. 11. Referring to FIG. 13, auxiliary light-shielding members 223, like their counterpart of FIG. 12, may extend in the second direction (e.g., the y-axis direction) without discontinuity and may partially overlap gate lines 121. Unlike their counterpart of FIG. 11, light-shielding conductive layers 280, which are adjacent to one another in the first direction (e.g., the x-axis direction), may be spaced from one another with data lines 171 and the auxiliary light-shielding members 223 interposed thereamong. For example, in a plan view, the light-shielding conductive layers 280 may not overlap the data lines 171. In a plan view, the light-shielding conductive layers 280 may not overlap at all, or may only partially overlap, the auxiliary light-shielding members 223, which cover the data lines 171.

The arrangement of the light-shielding conductive layers 280 and the auxiliary light-shielding members 223 is not limited to that illustrated in FIG. 12 or 13, but may vary.

The structure of the peripheral area CA of the display device 1 will hereinafter be described with reference to FIGS. 14 through 17 and further reference to FIGS. 1 through 13, focusing mainly on the array substrate 10. In FIGS. 1 through 17, like reference numerals indicate like elements, and thus, detailed descriptions thereof will not be repeated. FIGS. 14 through 17 are exemplary cross-sectional views, taken along line A-A' of FIG. 1, of the display device of FIGS. 2 through 4.

Figure 14:
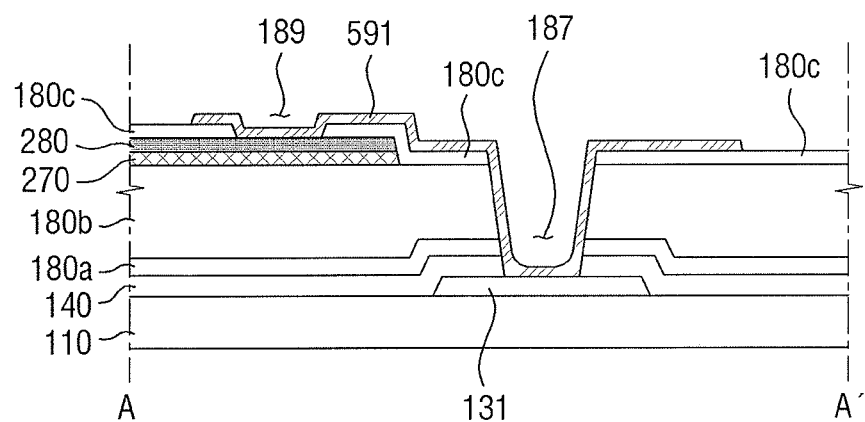
FIGS. 14 through 17 illustrate exemplary cross-sectional views, taken along line A-A' of FIG. 1, of the display device of FIGS. 2 through 4.

Referring to FIGS. 1 and 14, the voltage line 131 may be on the first base substrate 110 in the peripheral area CA. In some exemplary embodiments, the voltage line 131 may be on the same layer as the gate lines 121 and may include the same material as the gate lines 121. However, the present disclosure is not limited to these exemplary embodiments. In other exemplary embodiments, the voltage line 131 may be on the same layer as the data line 171 and may include the same material as the data line 171. In the description that follows, it is assumed that the voltage line 131 is on the same layer as the gate lines 121.

In some exemplary embodiments, the gate insulating layer 140, the first passivation layer 180*a*, and the insulating layer 180*b* may be sequentially disposed on the voltage line 131. More specifically, the first electrode 270 may be on the insulating layer 180*b*, and the light-shielding conductive layer 280 may be on the first electrode 270. The second passivation layer 180*c* may be on the light-shielding conductive layer 280. However, the present disclosure is not limited to these exemplary embodiments. In other exemplary embodiments, the insulating layer 180*b* may not be provided in the peripheral area CA.

The gate insulating layer 140, the first passivation layer 180*a*, the insulating layer 180*b*, and the second passivation layer 180*c* may include the external contact hole 187 extending therethrough, which exposes the voltage line 131.

The first electrode 270 and the voltage line 131 may be electrically connected to each other via a connecting electrode 591, and may receive the common voltage Vcom from the voltage line 131. For example, the second passivation layer 180*c* may also include an auxiliary contact hole 189, which partially exposes the light-shielding conductive layer 280. The connecting electrode 591 may be on the second passivation layer 180*c*. The connecting electrode 591 may be electrically and physically connected to the voltage line 131 via the external contact hole 187, and may be electrically and physically connected to the light-shielding conductive layer 280 via the auxiliary contact hole 189. That is, the light-shielding conductive layer 280 may directly contact the connecting electrode 591, and the connecting electrode 591 may directly contact the voltage line 131. Since the light-shielding conductive layer 280 directly contacts the first electrode 270, the common voltage, which is supplied to the voltage line 131, may be provided to the first electrode 270 via the connecting electrode 591 and the light-shielding conductive layer 280.

In some exemplary embodiments, the connecting electrode 591 may be on the same layer as the second electrode 181 and may include the same material as the second electrode 191. However, the electrical connection between the first electrode 270 and the voltage line 131 is not limited to the example illustrated in FIG. 14, but may vary.

Figure 15:
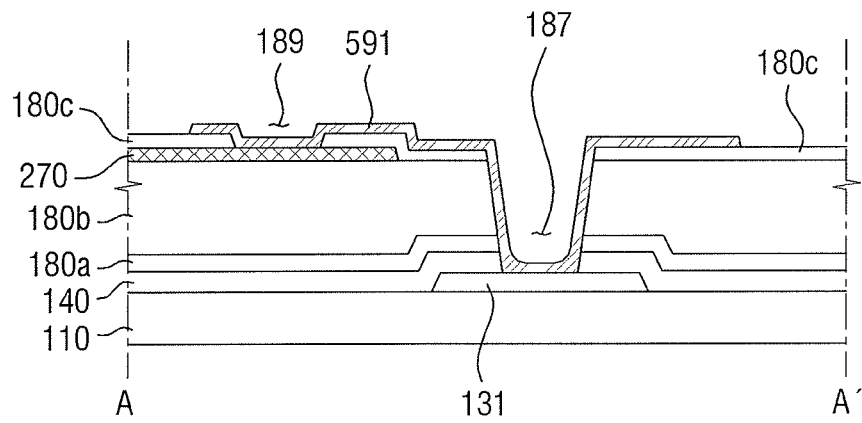

Alternatively, referring to FIGS. 1 and 15, the light-shielding conductive layer 280, unlike its counterpart of FIG. 14, may not be provided at least on the first electrode 270 in the peripheral area CA. The auxiliary contact hole 189 of the second passivation layer 180*c* may partially expose the first electrode 270. The connecting electrode 591 may be electrically and physically connected to the voltage line 131 via the external contact hole 187, and may be electrically and physically connected to the first electrode 270 via the auxiliary contact hole 189. That is, the first electrode 270 may directly contact the connecting electrode 591.

Figure 16:
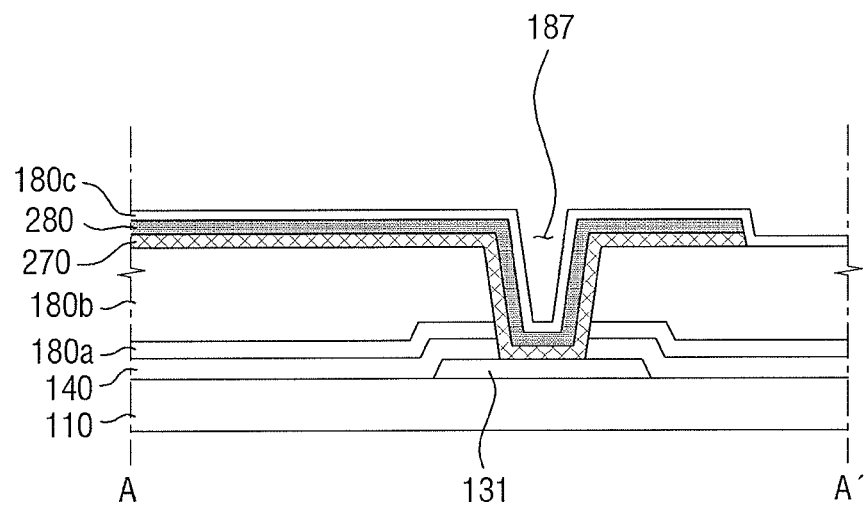

Alternatively, referring to FIGS. 1 and 16, the connecting electrode 591, unlike its counterpart of FIG. 14, may not be provided at all. For example, the second passivation layer 180*c* may not include the auxiliary contact hole (189 of FIG. 14), and the first electrode 270 may be physically and electrically connected to the voltage line 131 via the external contact hole 187. That is, the first electrode 270 may directly contact the voltage line 131. Also, the light shielding conductive layer 280 may extend along and directly contact the first electrode 270.

Figure 17:
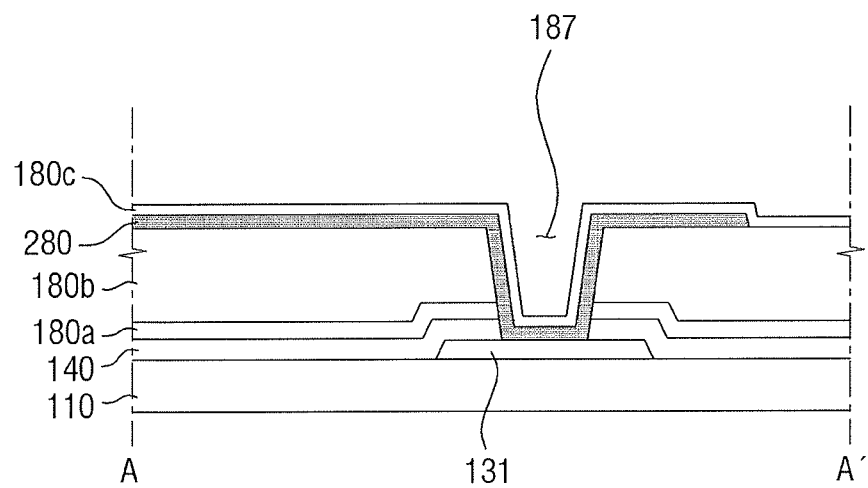

Alternatively, referring to FIGS. 1 and 17, the first electrode 270, unlike its counterpart of FIG. 16, may not be provided at least in the peripheral area CA. The light-shielding conductive layer 280 may be physically and electrically connected to the voltage line 131 via the external contact hole 187. That is, the light-shielding conductive layer 280 may directly contact the voltage line 131. The common voltage Vcom, which is supplied to the voltage line 131, may be provided to the first electrode 270, which contacts the light-shielding conductive layer 280, via the light-shielding conductive layer 280.

In the display device 1, the light-shielding conductive layer 280 may be provided to contact the first electrode 270. Thus, the resistance of the first electrode 270 may be reduced, the area in which the light-shielding member 221 needs to be provided may be reduced by blocking the transmission of light using the light-shielding conductive layer 280, and the aperture ratio and the transmissivity of the display device 1 may be improved. Also, since the transmission of light may be blocked using the light-shielding conductive layer 280 on the array substrate 10, the likelihood of light leakage that may be caused by a misalignment between the array substrate 10 and the opposite substrate 20 may be reduced or eliminated.

Other exemplary embodiments of the present disclosure will hereinafter be described. In the description of the exemplary embodiment of FIGS. 2 through 4 and the description that follows, identical or similar parts or elements are indicated by the same reference numerals.

Figure 18:
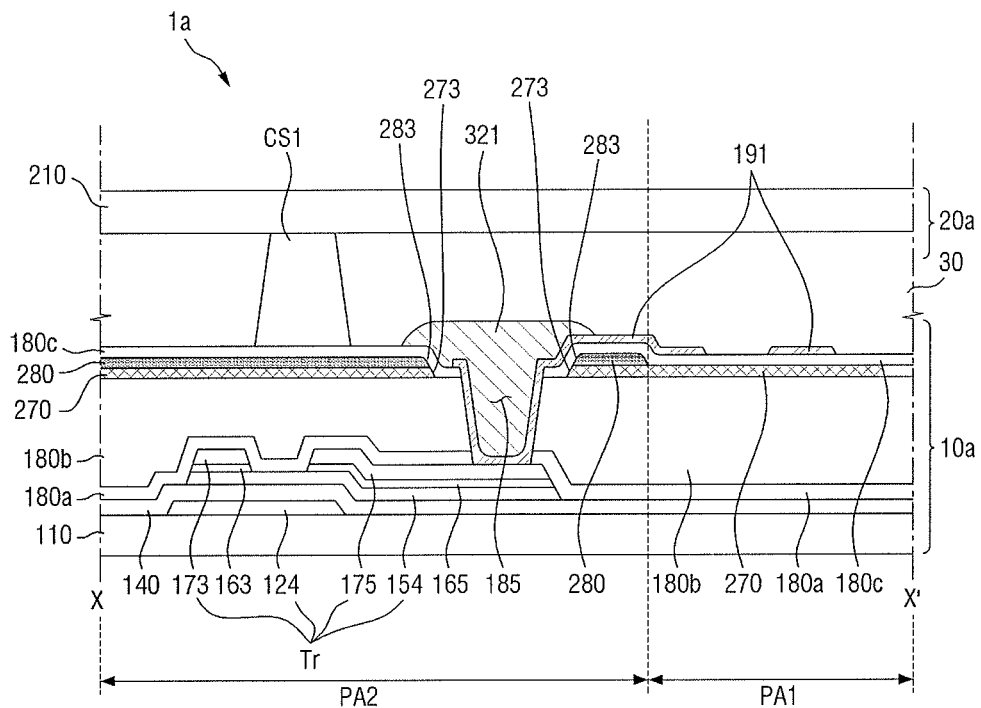
FIG. 18 illustrates a cross-sectional view, taken along line X-X' of FIG. 2, of a display device according to another exemplary embodiment of the present disclosure.
Figure 19:
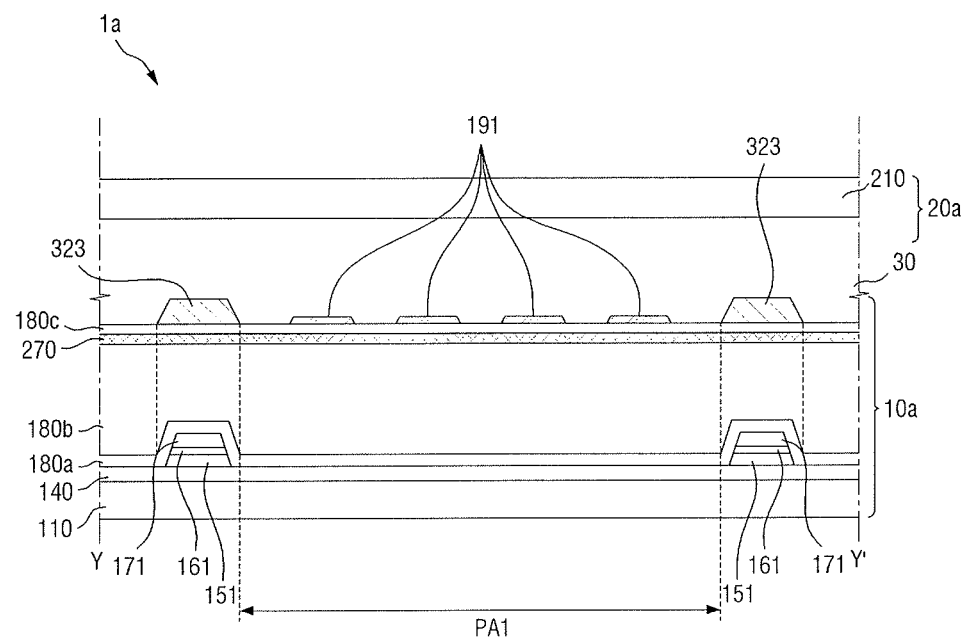
FIG. 19 illustrates a cross-sectional view, taken along line Y-Y' of FIG. 2, of the display device of FIG. 18.

FIG. 18 is a cross-sectional view, taken along line X-X' of FIG. 2, of a display device according to another exemplary embodiment of the present disclosure, and FIG. 19 is a cross-sectional view, taken along line Y-Y' of FIG. 2, of the display device of FIG. 18.

Referring to FIGS. 18 and 19, a display device 1a may include an array substrate 10a, an opposite substrate 20a, and the liquid crystal layer 30. The display device 1a may also include a spacer member CS1 between the array substrate 10a and the opposite substrate 20a.

The display device 1a may be substantially identical, or similar, to the display device 1 that has been described above with reference to FIGS. 2 through 17 (particularly, the display device 1 of FIGS. 2 and 3) except that a light-shielding member 321 and an auxiliary light-shielding member 323 are both on the array substrate 10a, rather than on the opposite substrate 20a. The electrical connection between the first electrode 270 and the voltage line 131 of the display device 1a in a peripheral area (CA of FIG. 1) may be substantially identical to that described above with reference to FIGS. 14 through 17. Thus, the display device 1a will hereinafter be described, focusing mainly on differences with the display device 1.

The light-shielding member 321 may be provided in an area corresponding to a contact hole 185 to cover the contact hole 185 and may reduce or prevent the occurrence of light leakage in an area around the contact hole 185. The light-shielding member 321, like its counterpart of FIG. 10, may cover a second opening 283 of a light-shielding conductive layer 280 and may reduce or prevent the occurrence of light leakage in an area around the second opening 283. The light-shielding member 321 may fill any height difference in, and may thus planarize, the area around the contact hole 185. In some exemplary embodiments, the light-shielding member 321 may be formed into the pattern of an island. The light-shielding member 321 may include a light-shielding pigment, e.g., black carbon or an opaque material, such as Cr, may include a photosensitive organic material, and so forth.

The auxiliary light-shielding member 323 may be on the array substrate 10a and may overlap a data line 171. The auxiliary light-shielding member 323, like the light-shielding member 321, may include a light-shielding pigment, e.g., black carbon or an opaque material such as Cr, a photosensitive organic material, and so forth. In some exemplary embodiments, the auxiliary light-shielding member 323 may be formed of the same material as the light-shielding member 321. The arrangement of the auxiliary light-shielding member 323 and the light-shielding conductive layer 280 may be substantially identical, or similar, to that described above with reference to FIGS. 11 through 13.

The spacer member CS1 may be on a second passivation layer 180c and may protrude toward the opposite substrate 20a. The spacer member CS1 may maintain the gap between the array substrate 10a and the opposite substrate 20a.

In some exemplary embodiments, the spacer member CS1 may be formed of an organic insulating material and may have photosensitivity. In some exemplary embodiments, the spacer member CS1 may include a light-shielding pigment and may be formed of the same material as the light-shielding member 321, in which case, the spacer member CS1 and the light-shielding member 321 may be formed at the same time by using a single optical mask (for example, a halftone mask). When the auxiliary light-shielding member 323 and the light-shielding member 321 are formed of the same material, the spacer member CS1, the light-shielding member 321, and the auxiliary light-shielding member 323 may be formed at the same time using a single optical mask.

The spacer member CS1 may be disposed to overlap a TFT Tr to improve the aperture ratio of the display device 1a. The opposite substrate 20a may include a second base substrate 210.

Figure 20:
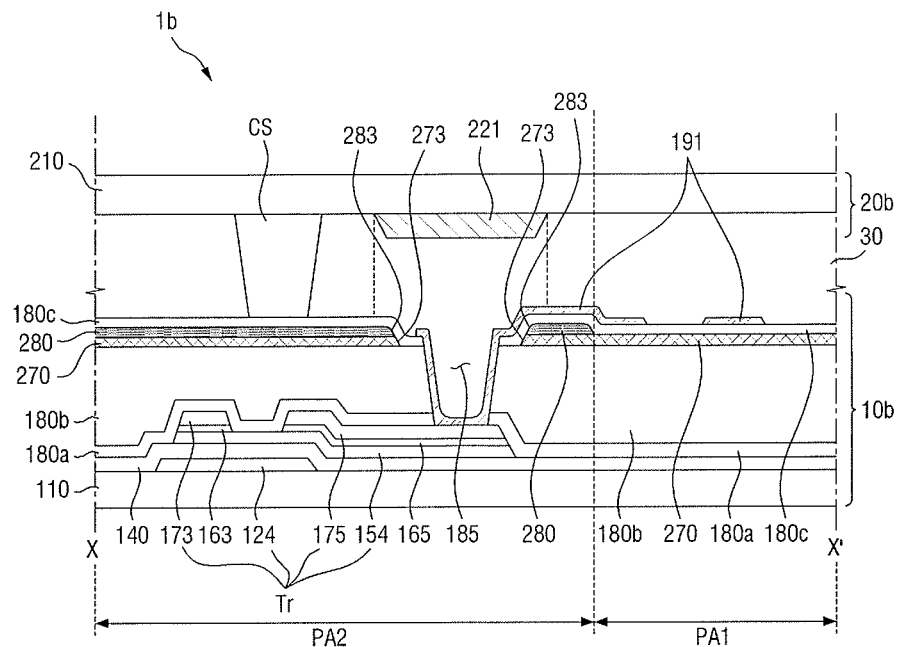
FIG. 20 illustrates a cross-sectional view, taken along line X-X' of FIG. 2, of a display device according to another exemplary embodiment of the present disclosure.
Figure 21:
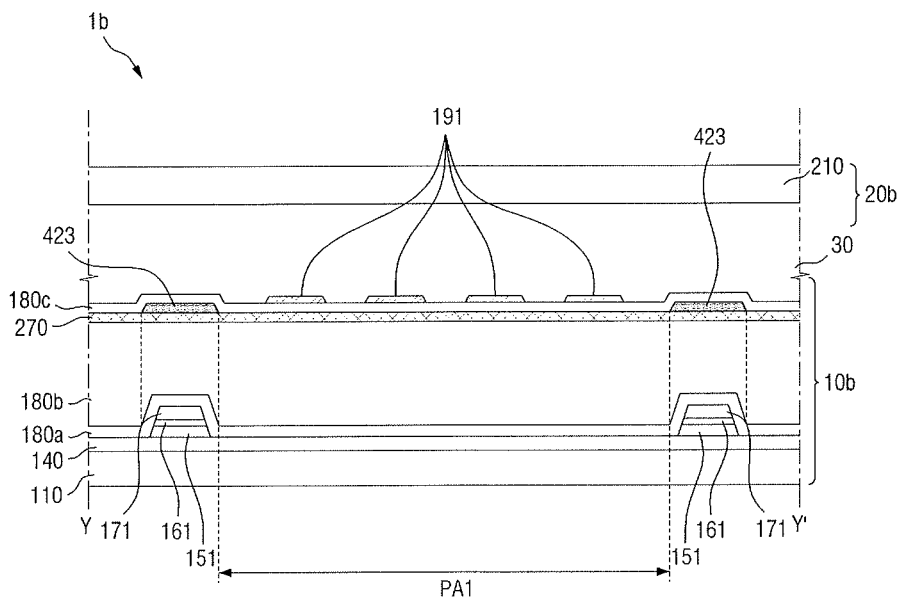
FIG. 21 illustrates a cross-sectional view, taken along line Y-Y' of FIG. 2, of the display device of FIG. 20.

FIG. 20 is a cross-sectional view, taken along line X-X' of FIG. 2, of a display device according to another exemplary embodiment of the present disclosure. FIG. 21 is a cross-sectional view, taken along line Y-Y' of FIG. 2, of the display device of FIG. 20. Referring to FIGS. 20 and 21, a display device 1b may include an array substrate 10b, an opposite substrate 20b, and a liquid crystal layer 30. The display device 1b may also include a spacer member CS, which is disposed between the array substrate 10b and the opposite substrate 20b.

The display device 1b may be substantially identical, or similar, to the display device 1 that has been described above with reference to FIGS. 2 through 17 (particularly, the display device 1 of FIGS. 2 and 3) except that an auxiliary light-shielding member 423 is on the array substrate 10b and a light-shielding member 221 is on the opposite substrate 20b. The electrical connection between a first electrode 270 and a voltage line 131 of the display device 1b in a peripheral area (PA of FIG. 1) may be substantially identical to that described above with reference to FIGS. 14 through 17.

The auxiliary light-shielding member 423 may be on the array substrate 10b and may overlap a data line 171. The auxiliary light-shielding member 423 may be between the first electrode 270 and the second passivation layer 180c, and may include a conductor having light-shielding properties, for example, an opaque metal. In some exemplary embodiments, the auxiliary light-shielding member 423 may include the same material as a light-shielding conductive layer 280. In some exemplary embodiments, the auxiliary light-shielding member 423 may have the same structure as the light-shielding conductive layer 280. For example, when the light-shielding conductive layer 280 has a single-layer structure, the auxiliary light-shielding member 423 may also have a single-layer structure, and, when the light-shielding conductive layer 280 has a multilayer structure, the auxiliary light-shielding member 423 may also have a multilayer structure. When, the light-shielding conductive layer 280 has a concentration gradient, the auxiliary light-shielding member 423 may also have a concentration gradient. That is, the auxiliary light-shielding member 423 may be on the same layer and formed of the same material, as the light-shielding conductive layer 280.

The opposite substrate 20b may include a second base substrate 210 and the light-shielding member 221. The spacer member CS may be on a first surface of the opposite substrate 20b that faces the array substrate 10b and may protrude toward the array substrate 10b, but the present disclosure is not limited thereto. That is, the spacer member CS1 of FIG. 18 may also be applicable to the display device 1b.

Figure 22:
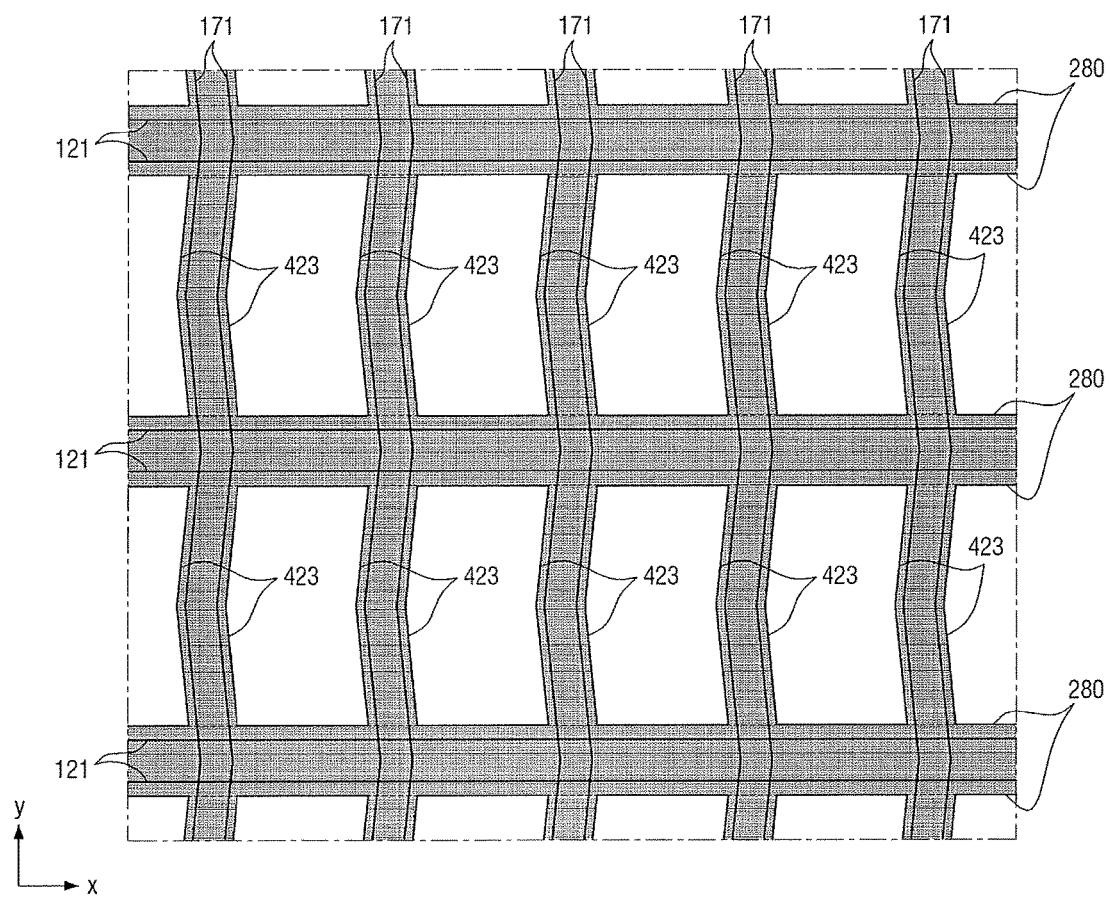
FIG. 22 illustrates a schematic plan view illustrating the arrangement of data lines, gate lines, light-shielding conductive layers, and auxiliary light-shielding members in a plurality of pixel areas of the display device of FIGS. 20 and 21.

The auxiliary light-shielding member 423 and the light-shielding conductive layer 280 of the display device 1b will hereinafter be described in further detail with reference to FIG. 22. FIG. 22 is a schematic plan view illustrating the arrangement of data lines, gate lines, light-shielding conductive layers, and auxiliary light-shielding members in a plurality of pixel areas of the display device of FIGS. 20 and 21.

Referring to FIGS. 20 through 22, in the display device 1b, auxiliary light-shielding members 423 and light-shielding conductive layers 280 may be physically connected to each other. That is, the light-shielding conductive layers 280 and the auxiliary light-shielding members 423 may be integral with each other. In a plan view, the light-shielding conductive layers 280, which cover gate lines 121, and the auxiliary light-shielding members 423, which cover data lines 171, may be integral with each other so as to form a mesh structure.

Figure 23:
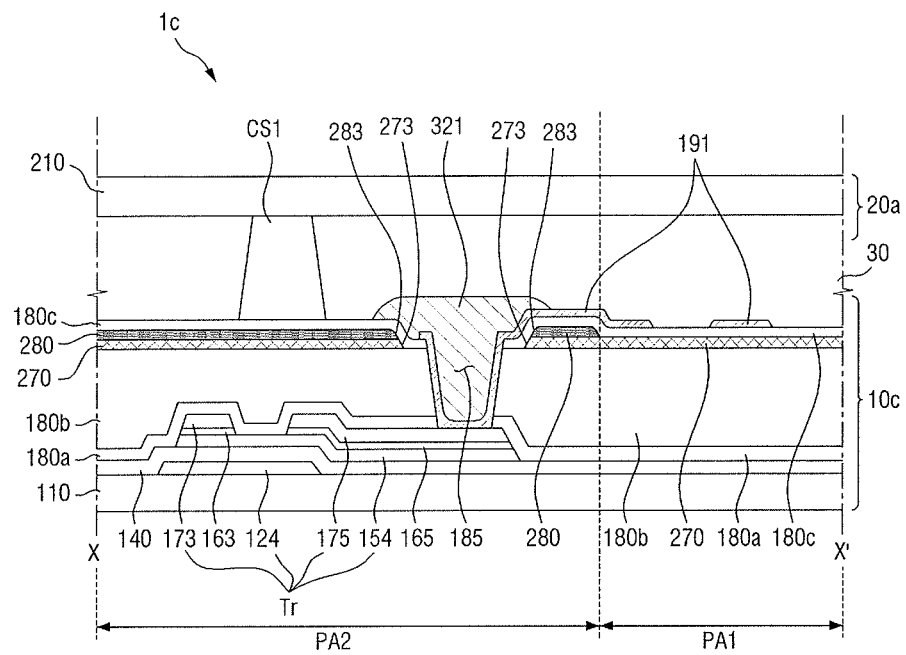
FIG. 23 illustrates a cross-sectional view, taken along line X-X' of FIG. 2, of a display device according to another exemplary embodiment of the present disclosure.
Figure 24:
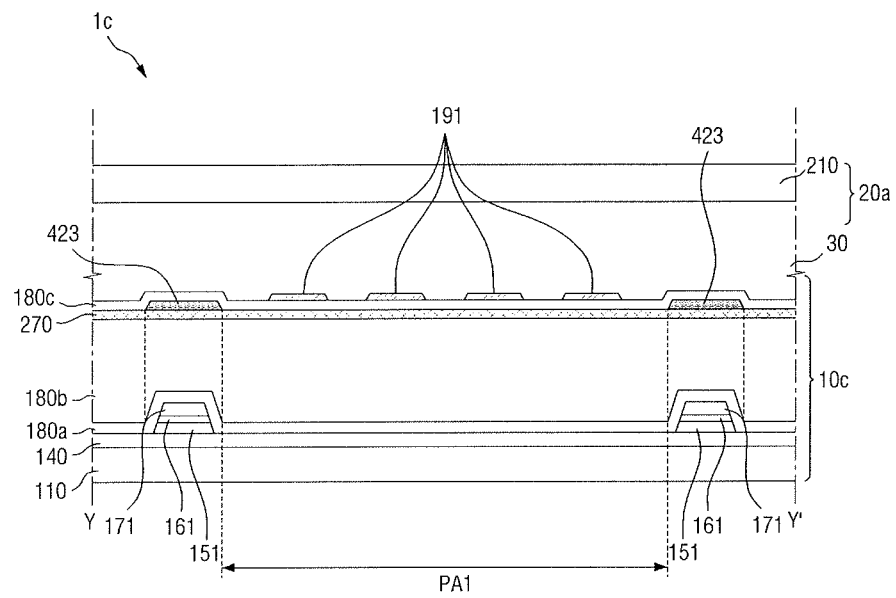
FIG. 24 illustrates a cross-sectional view, taken along line Y-Y' of FIG. 2, of the display device of FIG. 23.

FIG. 23 is a cross-sectional view, taken along line X-X' of FIG. 2, of a display device according to another exemplary embodiment of the present disclosure. FIG. 24 is a cross-sectional view, taken along line Y-Y' of FIG. 2, of the display device of FIG. 23.

Referring to FIGS. 23 and 24, a display device 1c may include an array substrate 10c, an opposite substrate 20a, and the liquid crystal layer 30. The display device 1c may also include a spacer member CS1, which is disposed between the array substrate 10c and the opposite substrate 20a.

The display device 1c may be substantially identical, or similar, to the display device 1 that has been described above with reference to FIGS. 2 through 17 (particularly, the display device 1 of FIGS. 2 through 4) except that a light-shielding member 321 and an auxiliary light-shielding member 423 are both on the array substrate 10c, rather than on the opposite substrate 20a. The electrical connection between the first electrode 270 and the voltage line 131 of the display device 1c in a peripheral area (CA of FIG. 1) may be substantially identical to that described above with reference to FIGS. 14 through 17.

The light-shielding member 321 is substantially identical to its counterpart of FIGS. 18 and 19, and the auxiliary light-shielding member 423 is substantially identical to its counterpart of FIGS. 20 through 22. Thus, the display device 1c will hereinafter be described, focusing mainly on differences with the display device 1a of FIGS. 18 and 19 and the display device 1b of FIGS. 20 through 22.

The opposite substrate 20a may include a second base substrate 210. The spacer member CS1 may be disposed on a second passivation layer 180c and may protrude toward the opposite substrate 20a.

Figure 25:
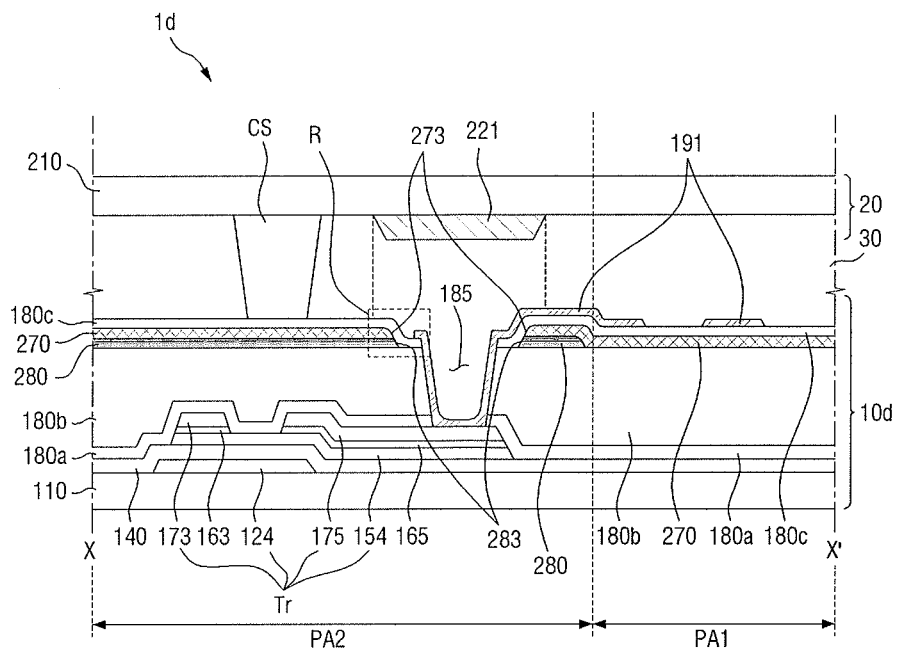
FIG. 25 illustrates a cross-sectional view, taken along line X-X' of FIG. 2, of a display device according to another exemplary embodiment of the present disclosure.
Figure 26:
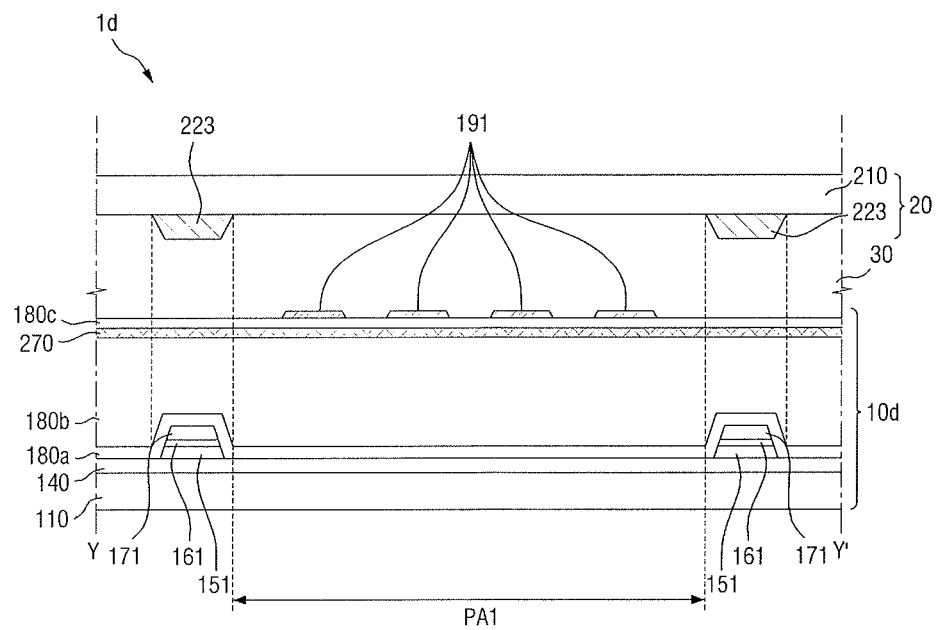
FIG. 26 illustrates a cross-sectional view, taken along line Y-Y' of FIG. 2, of the display device of FIG. 25.

FIG. 25 is a cross-sectional view, taken along line X-X' of FIG. 2, of a display device according to another exemplary embodiment of the present disclosure. FIG. 26 is a cross-sectional view, taken along line Y-Y' of FIG. 2, of the display device of FIG. 25.

Referring to FIGS. 25 and 26, a display device 1d may include an array substrate 10d, the opposite substrate 20, and the liquid crystal layer 30. The display device 1d may also include a pair of polarizers on the outer surfaces of the array substrate 10d and the opposite substrate 20.

The display device 1d may be substantially identical, or similar, to the display device 1 that has been described above with reference to FIGS. 2 through 17 (particularly, the display device 1 of FIGS. 2 through 4) except that a light-shielding conductive layer 280 is below the first electrode 270. Thus, the display device 1d will hereinafter be described, focusing mainly on the display device of FIGS. 2 through 4.

The light-shielding conductive layer 280 may be below the first electrode 270, particularly between the first electrode 270 and an insulating layer 180b. The light-shielding conductive layer 280 may directly contact the first electrode 270.

Figure 27:
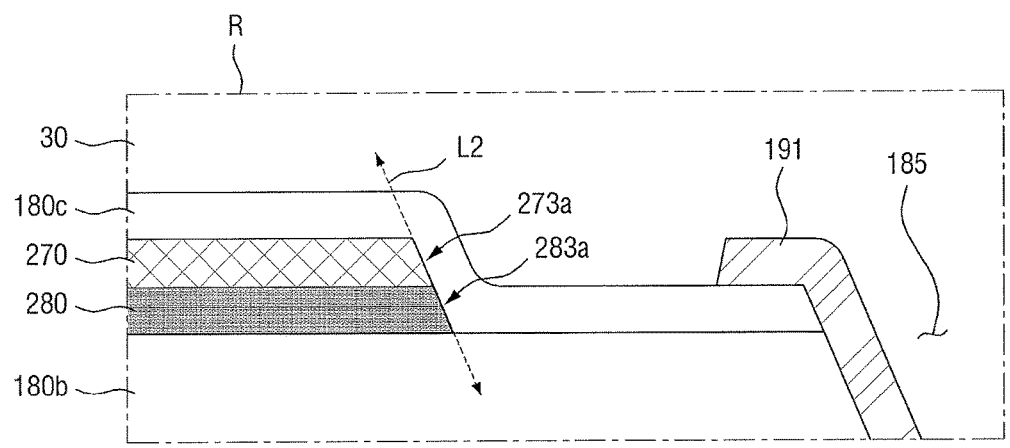
FIG. 27 illustrates an exemplary enlarged cross-sectional view of a portion R of FIG. 25.

The relationship between the first electrode 270 and the light-shielding conductive layer 280 of the display device 1d will hereinafter be described with reference to FIGS. 27 and 28. FIG. 27 is an exemplary enlarged cross-sectional view of a portion R of FIG. 25, and FIG. 28 is another exemplary enlarged cross-sectional view of the portion R of FIG. 25.

Referring to FIGS. 25 through 27, in some exemplary embodiments, the first opening inner side 273a of the first electrode 270 and the second opening inner side 283a of the light-shielding conductive layer 280 may be disposed substantially on the same straight line, i.e., a straight line L2. For example, the first opening 273 of the first electrode 270 and the second opening 283 of the light-shielding conductive layer 280 may be formed by wet-etching the first electrode 270 and the light-shielding conductive layer 280 using the same etching mask. Thus, the first opening inner side 273a of the first electrode 270 and the second opening inner side 283a of the light-shielding conductive layer 280 may both be disposed the straight line L2. In other words, the first opening 273 of the first electrode 270 and the second opening 283 of the light-shielding conductive layer 280 may share the same etched surface.

Figure 28:
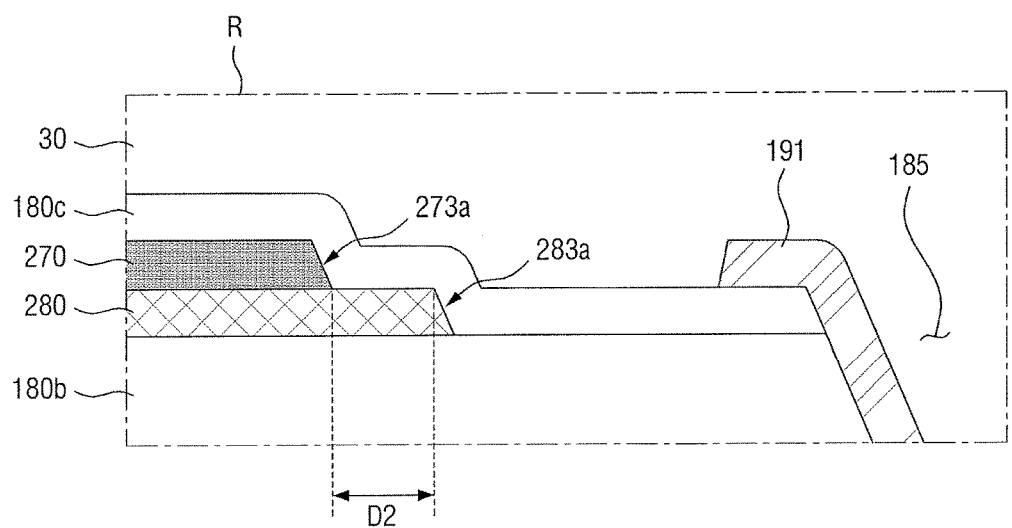
FIG. 28 illustrates another exemplary enlarged cross-sectional view of the portion R of FIG. 25.

Alternatively, referring to FIGS. 25, 26, and 28, the first opening inner side 273a of the first electrode 270 and the second opening inner side 283a of the light-shielding conductive layer 280 may not be disposed on the same straight line. For example, the first opening inner side 273a may be further apart than the second opening inner side 283a to a contact hole 185. A minimum distance D2 between the first opening inner side 273a and the second opening inner side 283a may be 0 μm to 0.3 μm. The first opening 273 of the first electrode 270 and the second opening 283 of the light-shielding conductive layer 280 may be formed by etching the first electrode 270 and the light-shielding conductive layer 280 using the same etching mask. when the first electrode 270 and the light-shielding conductive layer 280 are wet-etched using the same etching mask, the first electrode 270 may be etched first, thereby forming the first opening 273, and then, the light-shielding conductive layer 280 may be etched, thereby forming the second opening 283. Since the first opening 273 may be exposed to an etchant for a relatively longer period of time than the second opening 283 and may thus be etched more than necessary during the formation of the first opening 273. As a result, the second opening inner side 283a may be closer than the first opening inner side 273a to the contact hole 185.

The structure of a peripheral area CA of the display device 1*d* will hereinafter be described with reference to FIGS. 29 through 32 and further reference to FIGS. 25 through 27, focusing mainly on the array substrate 10*d*. FIGS. 29 through 32 are exemplary cross-sectional views, taken along line A-A' of FIG. 1, of the display device of FIGS. 25 and 26.

Figure 29:
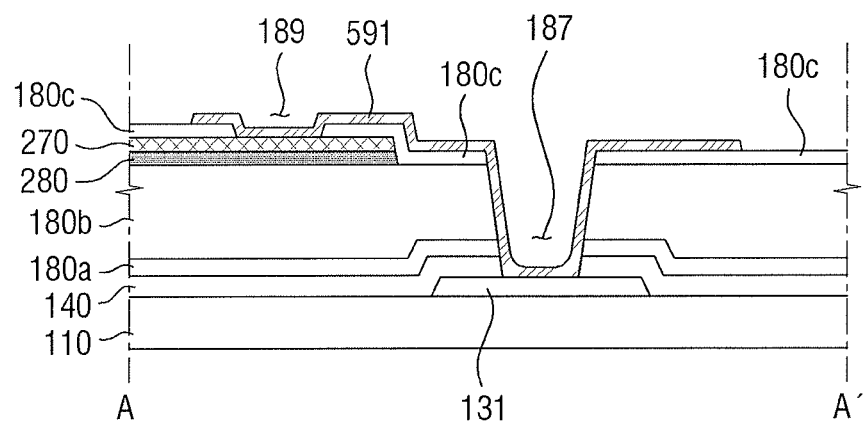
FIGS. 29 through 32 illustrate exemplary cross-sectional views, taken along line A-A' of FIG. 1, of the display device of FIGS. 25 and 26.

Referring to FIGS. 1 and 29, the voltage line 131 may be on the first base substrate 110 in the peripheral area CA.

In some exemplary embodiments, a gate insulating layer 140, a first passivation layer 180*a*, and the insulating layer 180*b* may be sequentially disposed on the voltage line 131. The light-shielding conductive layer 280 may be on the insulating layer 180*b* and the first electrode 270 may be on the light-shielding conductive layer 280. The second passivation layer 180*c* may be on the first electrode 270. However, the present disclosure is not limited to these exemplary embodiments. In other exemplary embodiments, the insulating layer 180*b* may not be provided at least in the peripheral area CA.

The gate insulating layer 140, the first passivation layer 180*a*, the insulating layer 180*b*, and the second passivation layer 180*c* may include an external contact hole 187, which exposes the voltage line 131.

The first electrode 270 and the voltage line 131 may be electrically connected to each other via a connecting electrode 591, and may receive the common voltage Vcom from the voltage line 131. For example, the second passivation layer 180*c* may also include an auxiliary contact hole 189, which partially exposes the first electrode 270. The connecting electrode 591 may be disposed on the second passivation layer 180*c*. The connecting electrode 591 may be electrically and physically connected to the voltage line 131 via the external contact hole 187, and may be electrically and physically connected to the first electrode 270 via the auxiliary contact hole 189.

In some exemplary embodiments, the connecting electrode 591 may be on the same layer as a second electrode 181 and may include the same material as the second electrode 191.

Figure 30:
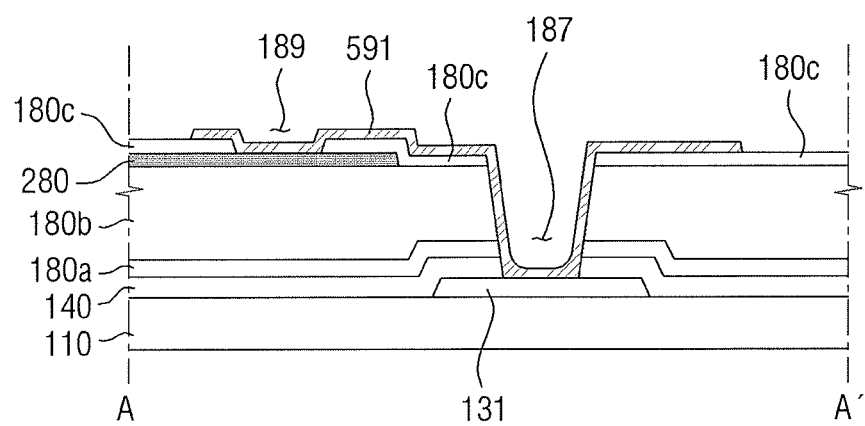

Alternatively, referring to FIGS. 1 and 30, the first electrode 270, unlike its counterpart of FIG. 29, may not be on at least the light-shielding conductive layer 280 in the peripheral area CA. The auxiliary contact hole 189 of the second passivation layer 180*c* may partially expose the light-shielding conductive layer 280. The connecting electrode 591 may be electrically and physically connected to the voltage line 131 via the external contact hole 187, and may be electrically and physically connected to the light-shielding conductive layer 280 via the auxiliary contact hole 189.

Figure 31:
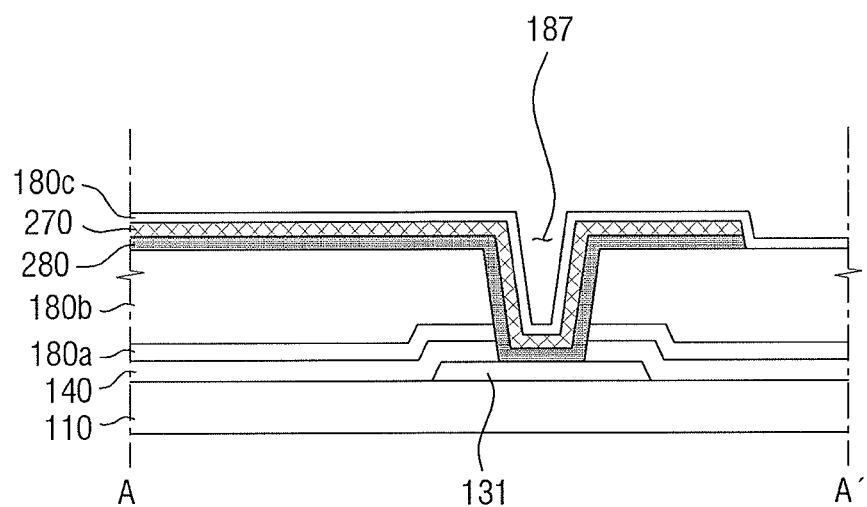

Alternatively, referring to FIGS. 1 and 31, the connecting electrode 591, unlike its counterpart of FIG. 29, may not be provided at all. For example, the second passivation layer 180*c* may not include the auxiliary contact hole (189 of FIG. 29), and the light-shielding conductive layer 280 may be physically and electrically connected to the voltage line 131 via the external contact hole 187. The common voltage Vcom, which is supplied to the voltage line 131, may be provided to the first electrode 270, which contacts the light-shielding conductive layer 280, via the light-shielding conductive layer 280.

Figure 32:
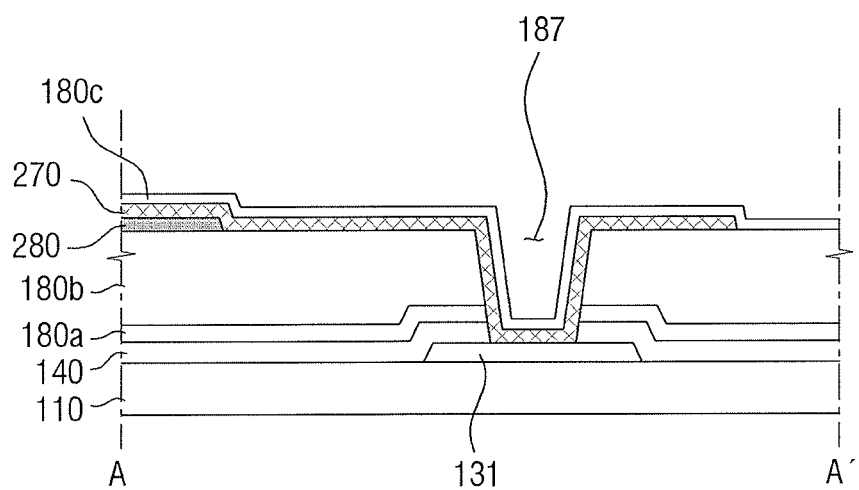

Alternatively, referring to FIGS. 1 and 32, the light-shielding conductive layer 280, unlike its counterpart of FIG. 29, may not be provided at least in the peripheral area CA. The first electrode 270 may be physically and electrically connected to the voltage line 131 via the external contact hole 187.

Figure 33:
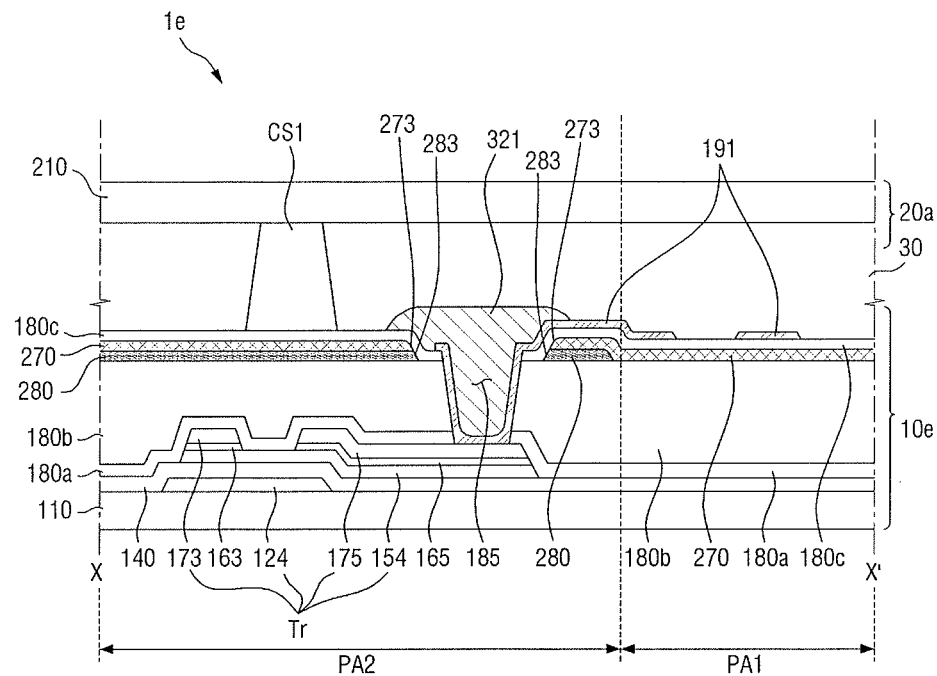
FIG. 33 illustrates a cross-sectional view, taken along line X-X' of FIG. 2, of a display device according to another exemplary embodiment of the present disclosure.
Figure 34:
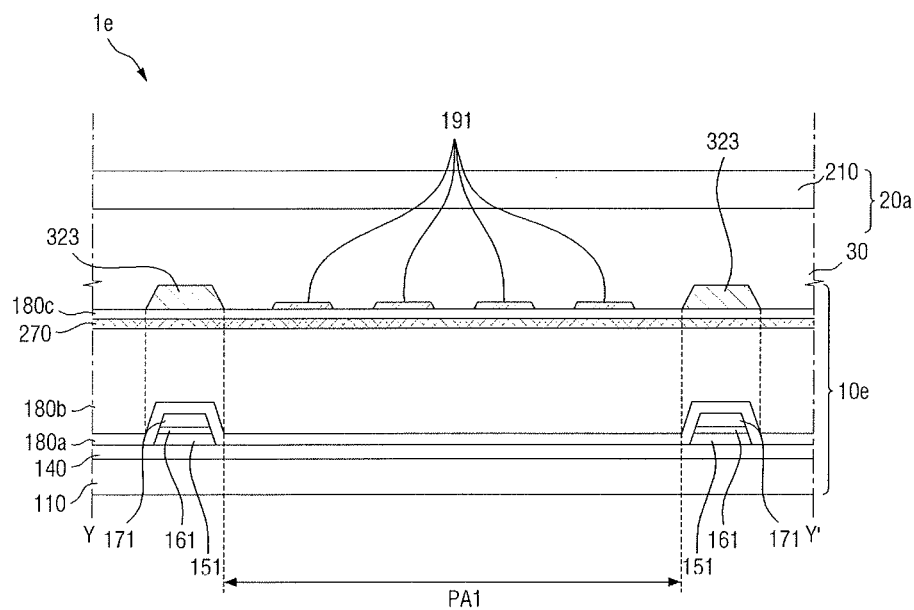
FIG. 34 illustrates a cross-sectional view, taken along line Y-Y' of FIG. 2, of the display device of FIG. 33.

FIG. 33 is a cross-sectional view, taken along line X-X' of FIG. 2, of a display device according to another exemplary embodiment of the present disclosure, and FIG. 34 is a cross-sectional view, taken along line Y-Y' of FIG. 2, of the display device of FIG. 33.

Referring to FIGS. 33 and 34, a display device 1*e* may include an array substrate 10*e*, the opposite substrate 20*a*, and the liquid crystal layer 30. The display device 1*e* may also include the spacer member CS1 between the array substrate 10*e* and the opposite substrate 20*a*.

The display device 1*e* may be substantially identical, or similar, to the display device 1*d* that has been described above with reference to FIGS. 25 through 27 (particularly, the display device 1*d* of FIGS. 25 and 26) except that the light-shielding member 321 and the auxiliary light-shielding member 323 are both on the array substrate 10*e*, rather than on the opposite substrate 20*a*. The electrical connection between the first electrode 270 and the voltage line 131 of the display device 1*e* in a peripheral area (CA of FIG. 1) may be substantially identical to that described above with reference to FIGS. 29 through 32. Thus, a detailed description of the display device 1*e* will not be repeated.

Figure 35:
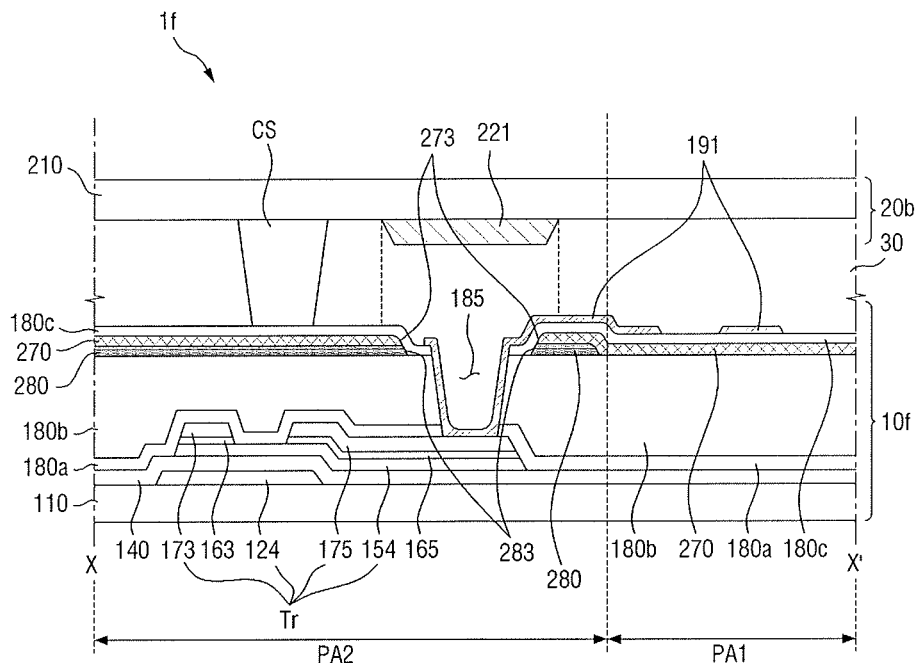
FIG. 35 illustrates a cross-sectional view, taken along line X-X' of FIG. 2, of a display device according to another exemplary embodiment of the present disclosure.
Figure 36:
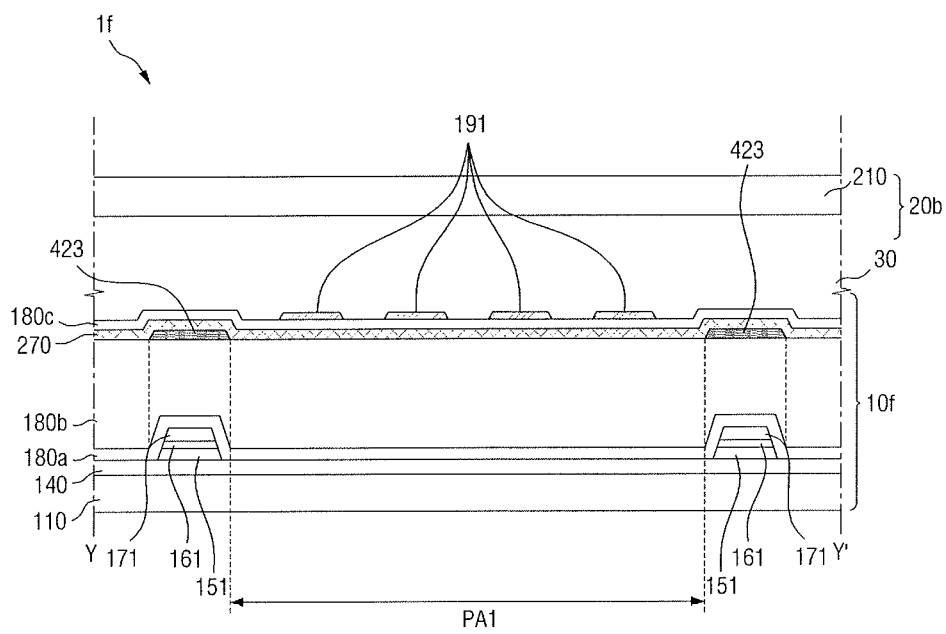
FIG. 36 illustrates a cross-sectional view, taken along line Y-Y' of FIG. 2, of the display device of FIG. 35.

FIG. 35 is a cross-sectional view, taken along line X-X' of FIG. 2, of a display device according to another exemplary embodiment of the present disclosure. FIG. 36 is a cross-sectional view, taken along line Y-Y' of FIG. 2, of the display device of FIG. 35.

Referring to FIGS. 35 and 36, a display device 1*f* may include an array substrate 10*f*, the opposite substrate 20*b*, and the liquid crystal layer 30. The display device 1*f* may also include the spacer member CS between the array substrate 10*f* and the opposite substrate 20*b*.

The display device 1*f* may be substantially identical, or similar, to the display device 1*d* that has been described above with reference to FIGS. 25 through 27 (particularly, the display device 1*d* of FIGS. 25 and 26) except that the light-shielding member 221 is on the opposite substrate 20*b* and the auxiliary light-shielding member 423 is on the array substrate 10*f*. The electrical connection between the first electrode 270 and the voltage line 131 of the display device 1*f* in a peripheral area (CA of FIG. 1) may be substantially identical to that described above with reference to FIGS. 29 through 32. The display device 1*f* will hereinafter be described, focusing mainly on differences with the display device 1*d* of FIGS. 25 and 26.

The auxiliary light-shielding member 423 may be on the array substrate 10*f* and may overlap a data line 171. The auxiliary light-shielding member 423 may be between the insulating layer 180*b* and the first electrode 270, and may include a conductor having light-shielding properties, for example, an opaque metal. In some exemplary embodiments, the auxiliary light-shielding member 423 may be on the same layer and formed of the same material, as the light-shielding conductive layer 280. Other features of the auxiliary light-shielding member 423 may be substantially identical, or similar, to those of the auxiliary light-shielding member 423 of FIGS. 20 through 22, and thus, detailed descriptions thereof will not be repeated.

Figure 37:
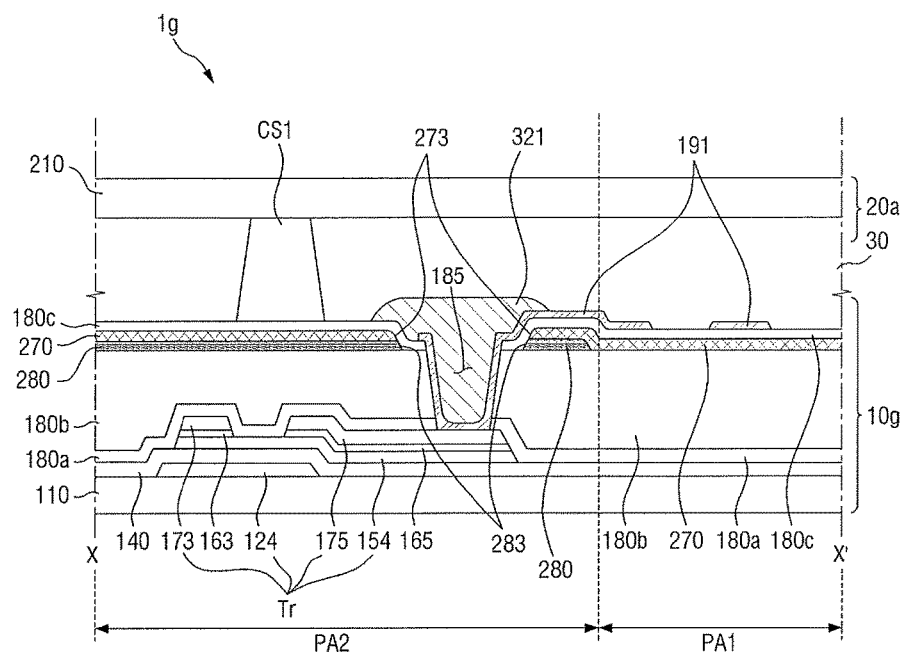
FIG. 37 illustrates a cross-sectional view, taken along line X-X' of FIG. 2, of a display device according to another exemplary embodiment of the present disclosure.
Figure 38:
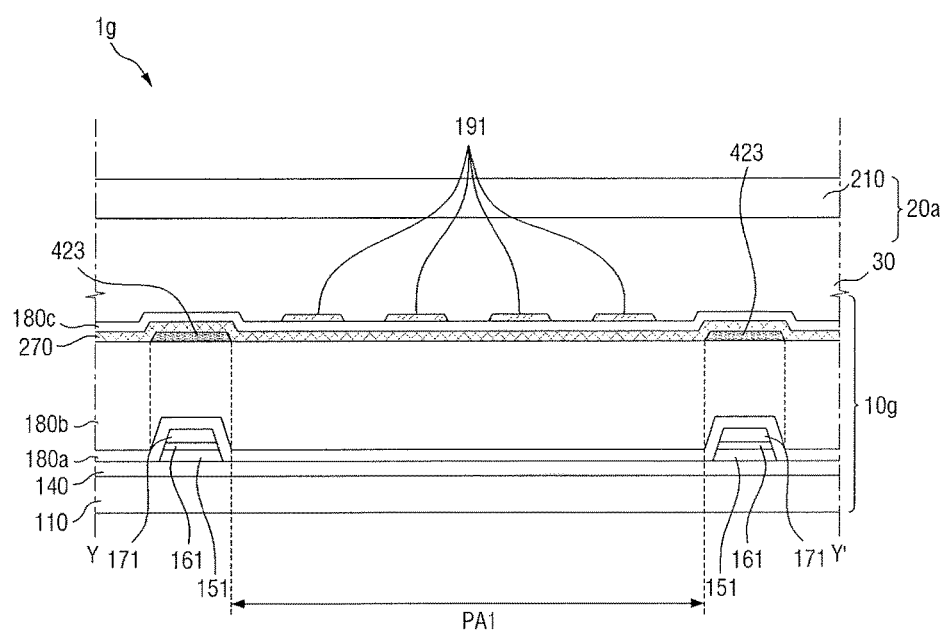
FIG. 38 illustrates a cross-sectional view, taken along line Y-Y' of FIG. 2, of the display device of FIG. 37.

FIG. 37 is a cross-sectional view, taken along line X-X' of FIG. 2, of a display device according to another exemplary embodiment of the present disclosure. FIG. 38 is a cross-sectional view, taken along line Y-Y' of FIG. 2, of the display device of FIG. 37.

Referring to FIGS. 37 and 38, a display device 1g may include an array substrate 10g, the opposite substrate 20a, and the liquid crystal layer 30. The display device 1g may also include the spacer member CS1 between the array substrate 10g and the opposite substrate 20a.

The display device 1g may be substantially identical, or similar, to the display device 1d that has been described above with reference to FIGS. 25 through 27 (particularly, the display device 1d of FIGS. 25 and 26) except that the light-shielding member 321 and the auxiliary light-shielding member 423 are both on the array substrate 10g. The electrical connection between the first electrode 270 and the voltage line 131 of the display device 1g in a peripheral area (CA of FIG. 1) may be substantially identical to that described above with reference to FIGS. 29 through 32. The display device 1f will hereinafter be described, focusing mainly on differences with the display device 1d of FIGS. 25 and 26. The light-shielding member 321 is substantially identical to its counterpart of FIGS. 18 and 19, and the auxiliary light-shielding member 423 is substantially identical to its counterpart of FIGS. 35 and 36.

Figure 39:
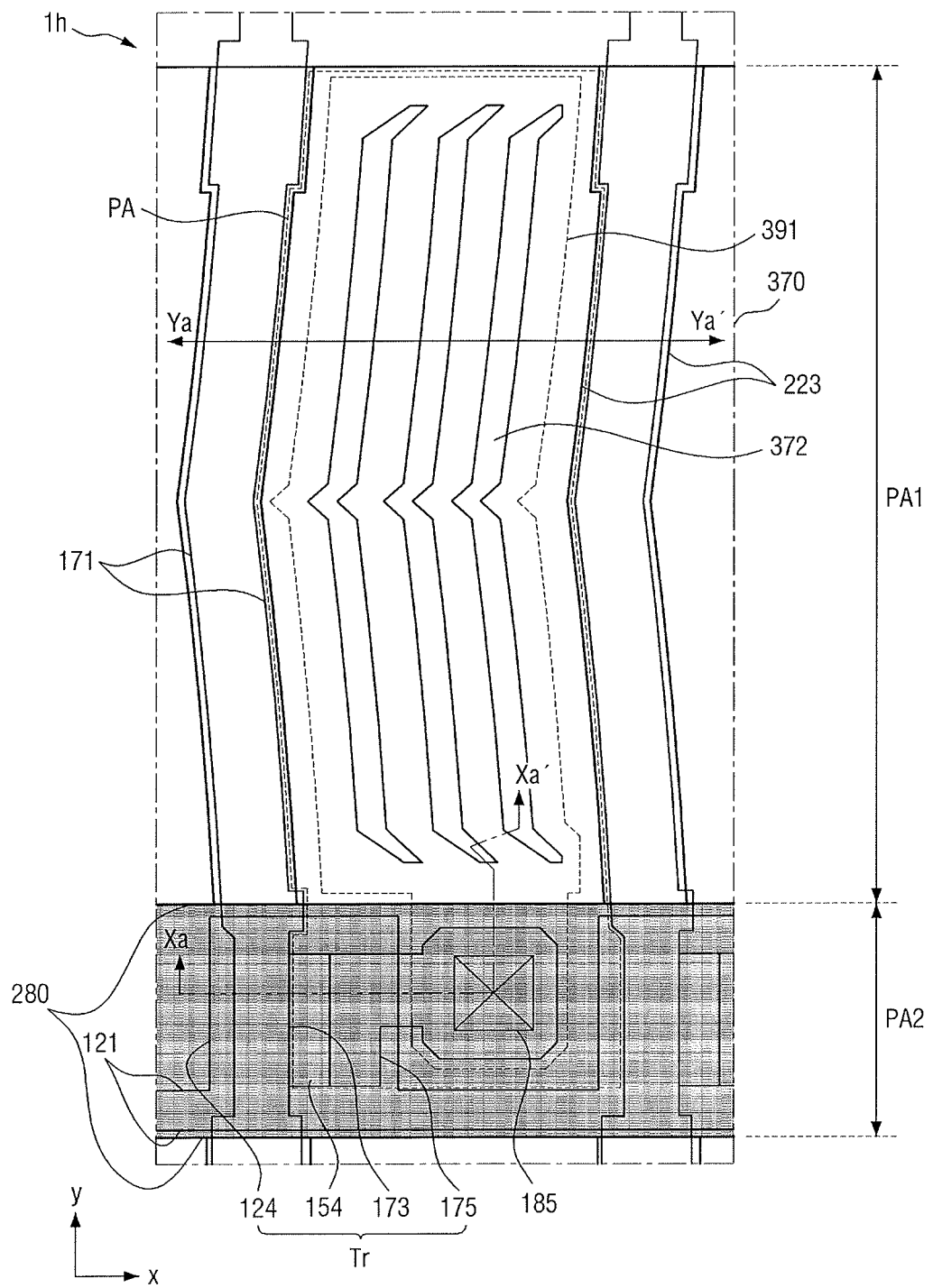
FIG. 39 illustrates a plan view of a pixel of a display device according to another exemplary embodiment of the present disclosure.
Figure 40:
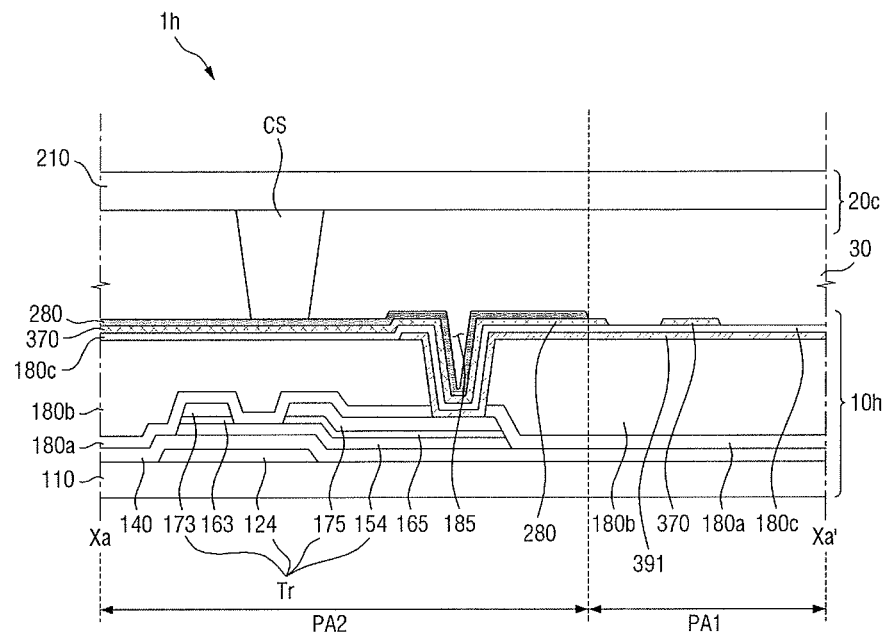
FIG. 40 illustrates a cross-sectional view taken along line Xa-Xa' of FIG. 39.
Figure 41:
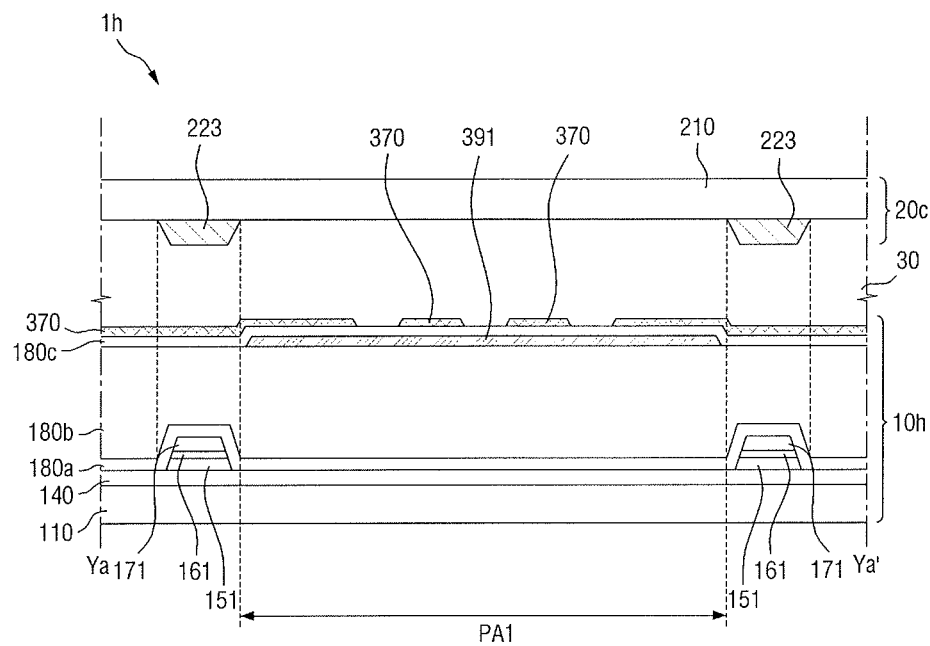
FIG. 41 illustrates a cross-sectional view taken along line Ya-Ya' of FIG. 39.

FIG. 39 is a plan view of a pixel of a display device according to another exemplary embodiment of the present disclosure. FIG. 40 is a cross-sectional view taken along line Xa-Xa' of FIG. 39. FIG. 41 is a cross-sectional view taken along line Ya-Ya' of FIG. 39.

Referring to FIGS. 39 through 41, a display device 1h may include an array substrate 10h, the opposite substrate 20c, which faces the array substrate 10h, and the liquid crystal layer 30 between the array substrate 10h and the opposite substrate 20c. The display device 1 may also include the spacer member CS between the array substrate 10h and the opposite substrate 20c. The display device 1h will hereinafter be described, focusing mainly on differences with the display device 1 of FIGS. 2 through 17.

The array substrate 10h may be a TFT array substrate on which switching devices such as, for example, TFTs, for driving a liquid crystal molecule in the liquid crystal layer 30 are formed. The opposite substrate 20c may be a substrate facing the array substrate 10h. The liquid crystal layer 30 may include a plurality of liquid crystal molecules having dielectric anisotropy.

The array substrate 10h will hereinafter be described. The gate line 121 and the gate electrode 124 may be on a first base substrate 110, which may be formed of transparent glass or plastic. The gate line 121 may transmit a gate signal and may extend substantially in a first direction (e.g., an x-axis direction). The gate electrode 124 may protrude from, and may be connected to, the gate line 121.

The gate insulating layer 140 may be on the gate line 121 and the gate electrode 124. The semiconductor layer 154 may be on the gate insulating layer 140 and may partially overlap the gate electrode 124.

The plurality of ohmic contact members (163 and 165) may be on the semiconductor layer 154. The ohmic contact members (163 and 165) may include the source ohmic contact member 163 below the source electrode 173 and the drain ohmic contact member 165 below the drain electrode 175.

The source electrode 173, the drain electrode 175, and the data line 171 may be on the source ohmic contact member 163, the drain ohmic contact member 165, and the gate insulating layer 140, respectively.

The data line 171 may transmit a data voltage and may extend substantially in a second direction (for example, a y-axis direction), which crosses the first direction, to intersect the gate line 121. In some exemplary embodiments, the pixel area PA may be defined by where the data line 71 and the gate line 121 intersect. The pixel area PA includes the first pixel area PA1 in which the pixel electrode 191 is located and the second pixel area PA2 in which a TFT Tr is located.

In some exemplary embodiments, the data line 171 may be periodically bent so as to improve the transmissivity of the display device 1h, as illustrated in FIG. 38.

In some exemplary embodiments, semiconductor patterns 151 and data ohmic contact members 161 may be provided between the data line 171 and the gate insulating layer 140. In some exemplary embodiments, in a case in which the semiconductor layer 154 and the semiconductor patterns 151 are formed of an oxide semiconductor, the source ohmic contact member 163, the drain ohmic contact member 165, and the data ohmic contact members 161 may not be provided.

The source electrode 173 may be connected to the data line 171, and may overlap the gate electrode 124. The drain electrode 175 may be isolated from the source electrode 173 over the gate electrode 124 and may face the source electrode 173. The drain electrode 175 may include a bar-shaped portion, which extends substantially in parallel to the source electrode 173, and an extended portion, which is on the opposite side of the bar-shaped portion from the source electrode 173.

The gate electrode 124, the source electrode 173, and the drain electrode 175 may form the TFT Tr together with the semiconductor layer 154. The TFT Tr may be provided in the second pixel area PA2 of the pixel area PA.

A first passivation layer 180a may be on the gate insulating layer 140, the semiconductor layer 154, the source electrode 173, and the drain electrode 175.

The insulating layer 180b may be on the first passivation layer 180a. In some exemplary embodiments, the insulating layer 180b may have a function of planarizing the top of the first passivation layer 180a.

In some exemplary embodiments, the insulating layer 180b may further include a color pigment. For example, the insulating layer 180b may include a color pigment capable of allowing the transmission of light of a particular color wavelength therethrough. However, the present disclosure is not limited to these exemplary embodiments. That is, in other exemplary embodiments, color filters may be additionally provided at the array substrate 10h or the opposite substrate 20c.

The contact hole 185, which partially exposes the drain electrode 175, may be formed through the first passivation layer 180a and the insulating layer 180b.

The first electrode 391 may be on the insulating layer 180b. In some exemplary embodiments, the first electrode 391 may be a pixel electrode. The first electrode 391 may have a planar shape, i.e., may be plate-shaped. The first electrode 391 may be in the first pixel area PA1 and may partially extend into the second pixel area PA2 and may, thus, be electrically and physically connected to the drain electrode 175 via the contact hole 185. As a result, the first electrode 391 may receive a voltage from the drain electrode 175.

In some exemplary embodiments, the first electrode 391 may be formed of a transparent conductive material, and the transparent conductive material may be, for example, ITO, IZO, ITZO, or AZO.

A second passivation layer 180c may be on the first electrode 391 and the insulating layer 180b. The second passivation layer 180c may include an inorganic insulating material such as silicon oxide, silicon nitride, silicon oxynitride, and the like. The second passivation layer 180*c* may reduce or prevent the insulating layer 180*b* from being lifted off from the underlying layers and may suppress or eliminate the contamination of the liquid crystal layer 30 by an organic material such as a solvent from the insulating layer 180*b*.

A second electrode 370 may be on the second passivation layer 180*c*. In some exemplary embodiments, the second electrode 370 may be a common electrode. The second electrode 370 may have a planar shape, may be on the first base substrate 110 as a plate, and may be provided with a common voltage Vcom, which is of a predetermined magnitude. In some exemplary embodiments, the second electrode 370 may be at least partially located in the contact hole 185.

In some exemplary embodiments, the first electrode 370 may be formed of a transparent conductive material, and the transparent conductive material may be, for example, ITO, IZO, ITZO, or AZO.

The second electrode 370 may at least partially overlap the first electrode 191. A plurality of slits 372 may be formed on the second electrode 370.

In some exemplary embodiments, in a case in which the data line 171 is curved, the second electrode 370 may be formed to have curved edges that extend substantially in parallel to the data line 171.

The light-shielding conductive layer 280 may be on the second electrode 370. The light-shielding conductive layer 280 may be formed along the first direction (e.g., a horizontal direction) in which the gate line 121 extends. In some exemplary embodiments, the light-shielding conductive layer 280 may be located in the second pixel area PA2 of the pixel area PA, but may not be provided in the first pixel area PA1. The light-shielding conductive layer 280 may overlap the TFT Tr. In some exemplary embodiments, the light-shielding conductive layer 280 may also overlap the gate line 121.

In some exemplary embodiments, the light-shielding conductive layer 280 may be at least partially located in the contact hole 185 and may cover the contact hole 185.

Other features of the light-shielding conductive layer 280 may be substantially identical, or similar, to those of the light-shielding conductive layer 280 of FIGS. 2 through 17, and thus, detailed descriptions thereof will not be repeated.

The opposite substrate 20*c* will hereinafter be described. The opposite substrate 20*c* may include the second base substrate 210, which faces the array substrate 10*h*, and the auxiliary light-shielding member 223.

The second base substrate 210, like the first base substrate 110, may be a transparent insulating substrate. The second base substrate 210 may include a polymer or plastic material with high thermal resistance. In some exemplary embodiments, the second base substrate 210 may have flexibility.

The auxiliary light-shielding member 223 may be formed along a direction in which the data line 171 extends, and may completely overlap the data line 171. The auxiliary light-shielding member 223 may completely cover the data line 171 in a plan view. The auxiliary light-shielding member 223 may include a light-shielding pigment, e.g., black carbon or an opaque material, such as Cr, a photosensitive organic material, and so forth. Other features of the auxiliary light-shielding member 223 may be substantially identical, or similar, to those of the auxiliary light-shielding member 223 of FIGS. 2 through 17, and thus, detailed descriptions thereof will not be repeated.

The spacer member CS, which maintains the gap between the array substrate 10*h* and the opposite substrate 20*c*, may be between the array substrate 10*h* and the opposite substrate 20*c*. The spacer member CS may maintain the gap between the array substrate 10*h* and the opposite substrate 20*c*. The spacer member CS may be formed of an organic insulating material and may have photosensitivity. In some exemplary embodiments, the spacer member CS may be formed of the same material as the auxiliary light-shielding member 223. In some exemplary embodiments, the spacer member CS may overlap the TFT Tr. In some exemplary embodiments, the spacer member CS may be disposed on the light-shielding conductive layer 280, but the present disclosure is not limited thereto. That is, in other exemplary embodiments, the spacer member CS may be disposed on the opposite substrate 20*c*. Other features of the space member CS may be substantially identical, or similar, to those of the spacer member CS of FIGS. 2 through 17, and thus, detailed descriptions thereof will not be repeated.

In the display device 1*h*, no additional light-shielding member is provided for covering the contact hole 185. Accordingly, the fabrication and the structure of the display device 1*h* may be further simplified.

The structure of a peripheral area CA of the display device 1*h* will hereinafter be described with reference to FIGS. 42 through 45, and further reference to FIGS. 39 through 41, focusing mainly on the array substrate 10*h*. FIGS. 42 through 45 are exemplary cross-sectional views, taken along line A-A' of FIG. 1, of the display device of FIGS. 39 through 41.

Figure 42:
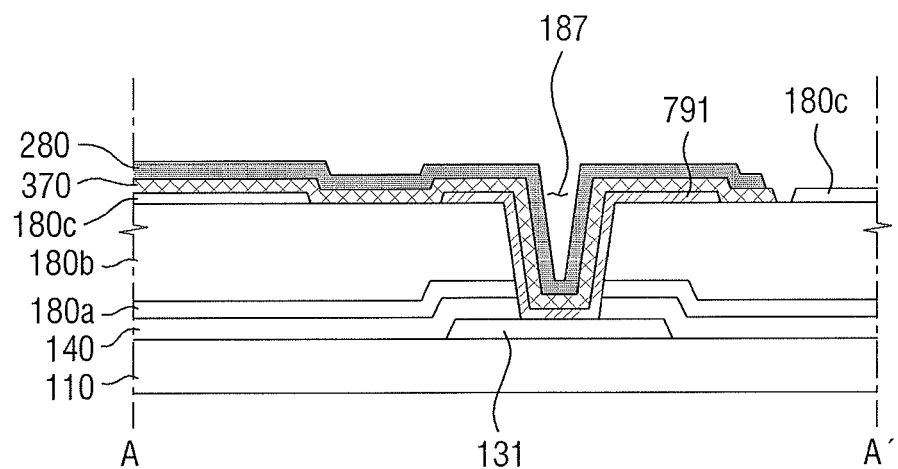
FIGS. 42 through 45 illustrate exemplary cross-sectional views, taken along line A-A' of FIG. 1, of the display device of FIGS. 39 through 41.

Referring to FIGS. 1 and 42, the voltage line 131 may be on the first base substrate 110 in the peripheral area CA. The gate insulating layer 140, the first passivation layer 180*a*, the insulating layer 180*b*, and the second passivation layer 180*c* may be sequentially disposed on the voltage line 131. The gate insulating layer 140, the first passivation layer 180*a*, the insulating layer 180*b*, and the second passivation layer 180*c* may include an external contact hole 187, which exposes the voltage line 131.

A connecting electrode 791 may be on the insulating layer 180*b*. The connecting electrode 791 may be electrically and physically connected to the voltage line 131 via the external contact hole 187. In some exemplary embodiments, the connecting electrode 791 may be on the same layer, and formed of the same material, as the first electrode 391. The second passivation layer 180*c* may be on the insulating layer 180*b* and may be at least partially removed to expose the connecting electrode 791.

The second electrode 370 and the light-shielding conductive layer 280 may be sequentially disposed on the insulating layer 180*b* and the second passivation layer 180*c*. The second electrode 370 may be electrically and physically connected to the connecting electrode 791. As a result, in response to the common voltage Vcom being applied to the voltage line 131, the common voltage Vcom may be provided to the second electrode 370 via the connecting electrode 791.

Figure 43:
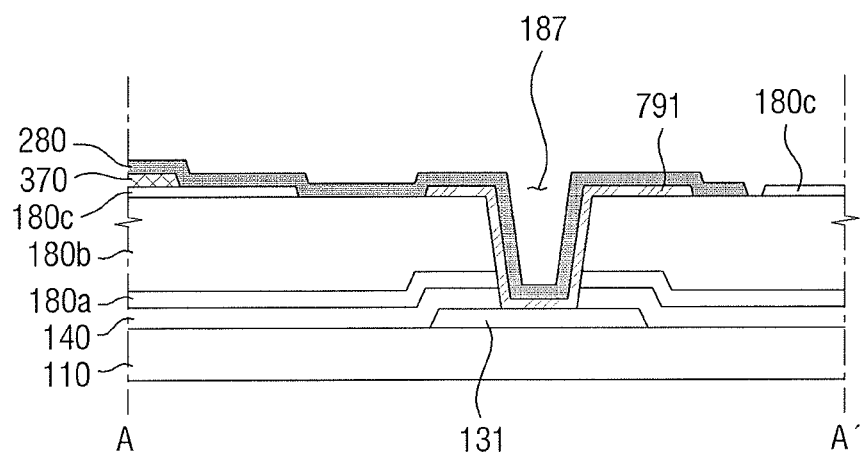

Alternatively, referring to FIGS. 1 and 43, the second electrode 370, unlike its counterpart of FIG. 42, may not be provided at least on the second passivation layer 180*c* in the peripheral area CA. The light-shielding conductive layer 280 may be electrically and physically connected to the connecting electrode 791. As a result, in response to the common voltage Vcom being applied to the voltage line 131, the common voltage Vcom may be provided to the second electrode 370 via the connecting electrode 791 and the light-shielding conductive layer 280.

Figure 44:
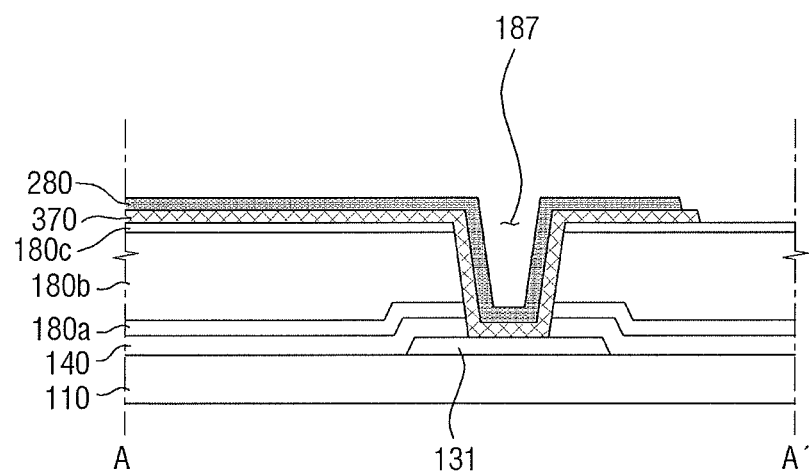

Alternatively, referring to FIGS. 1 and 44, the connecting electrode 791, unlike its counterpart of FIG. 42, may not be provided at all. For example, the second passivation layer 180c may be at least partially removed from around the external contact hole 187 to expose the voltage line 131, and the second electrode 370 may be physically and electrically connected to the voltage line 131 via the external contact hole 187.

Figure 45:
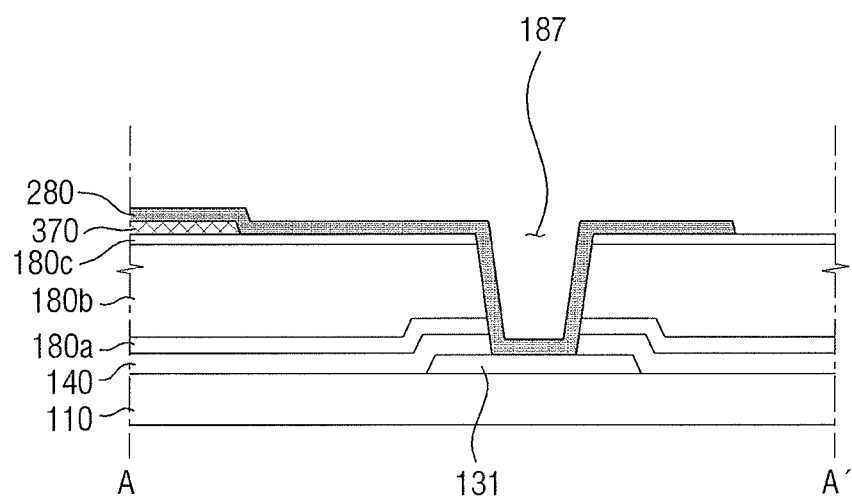

Alternatively, referring to FIGS. 1 and 45, the second electrode 370, unlike its counterpart of FIG. 44, may not be provided at least in the peripheral area CA. The second passivation layer 180c may be at least partially removed from around the external contact hole 187 to expose the voltage line 131, and the light-shielding conductive layer 280 may be physically and electrically connected to the voltage line 131 via the external contact hole 187.

In the display device 1h, the light-shielding conductive layer 280 may be provided to contact the second electrode 370. Thus, the resistance of the second electrode 370 may be reduced, the area in which a light-shielding member needs to be provided may be reduced by blocking the transmission of light using the light-shielding conductive layer 280, and the aperture ratio and the transmissivity of the display device 1h may be improved. Also, since the transmission of light may be blocked using the light-shielding conductive layer 280 on the array substrate 10h, no additional light-shielding member may be necessary for covering the contact hole 185. Thus, the likelihood of light leakage that may be caused by a misalignment between the array substrate 10h and the opposite substrate 20c may be reduced.

Figure 46:
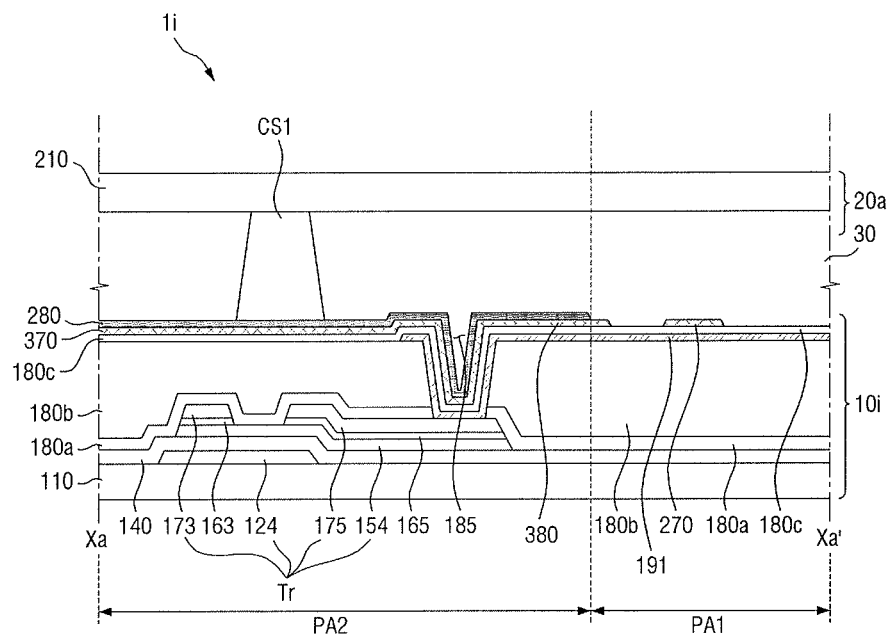
FIG. 46 illustrates a cross-sectional view, taken along line Xa-Xa' of FIG. 39, of a display device according to another exemplary embodiment of the present disclosure.
Figure 47:
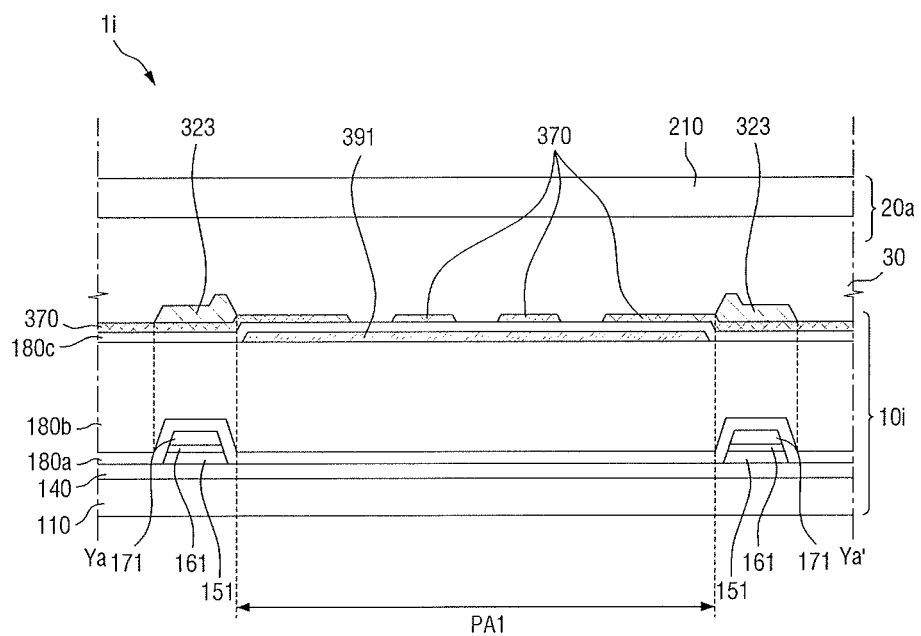
FIG. 47 illustrates a cross-sectional view, taken along line Ya-Ya' of FIG. 39, of the display device of FIG. 46.

FIG. 46 is a cross-sectional view, taken along line Xa-Xa' of FIG. 39, of a display device according to another exemplary embodiment of the present disclosure. FIG. 47 is a cross-sectional view, taken along line Ya-Ya' of FIG. 39, of the display device of FIG. 46.

Referring to FIGS. 46 and 47, a display device 1i may include an array substrate 10i, the opposite substrate 20a, and the liquid crystal layer 30. The display device 1i may also include the spacer member CS1 between the array substrate 10i and the opposite substrate 20a.

The display device 1i may be substantially identical, or similar, to the display device 1h that has been described above with reference to FIGS. 39 through 45 (particularly, the display device 1h of FIGS. 39 through 41) except that an auxiliary light-shielding member 323 is on the array substrate 10i. The electrical connection between a second electrode 370 and a voltage line 131 of the display device 1i in a peripheral area (CA of FIG. 1) may be substantially identical to that described above with reference to FIGS. 42 through 45. Other features of the auxiliary light-shielding member 323 and of the spacer member CS1 may be substantially identical, or similar, to those of the auxiliary light-shielding member 323 and of the spacer member CS1 of FIGS. 18 and 19, and thus, detailed descriptions thereof will not be repeated.

Figure 48:
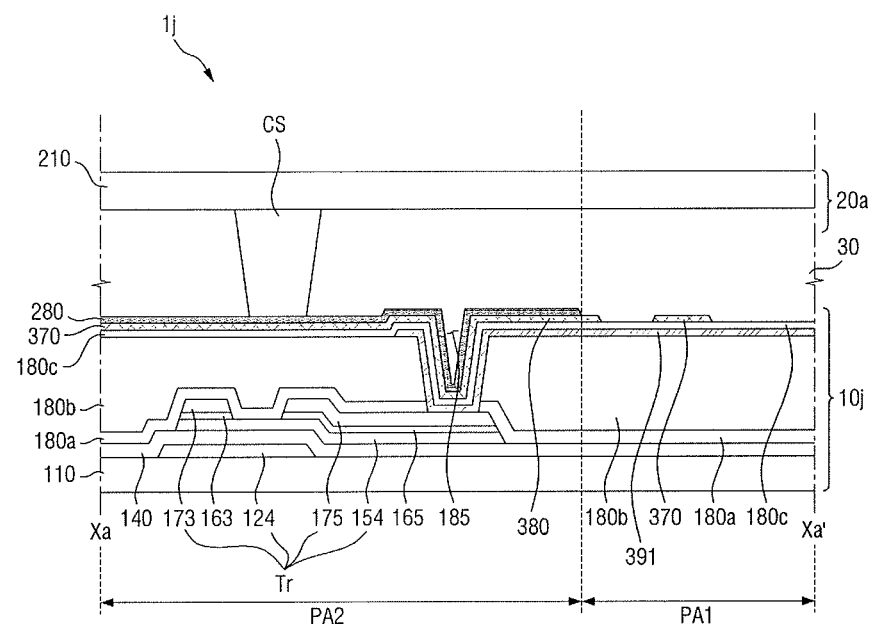
FIG. 48 illustrates a cross-sectional view, taken along line Xa-Xa' of FIG. 39, of a display device according to another exemplary embodiment of the present disclosure.
Figure 49:
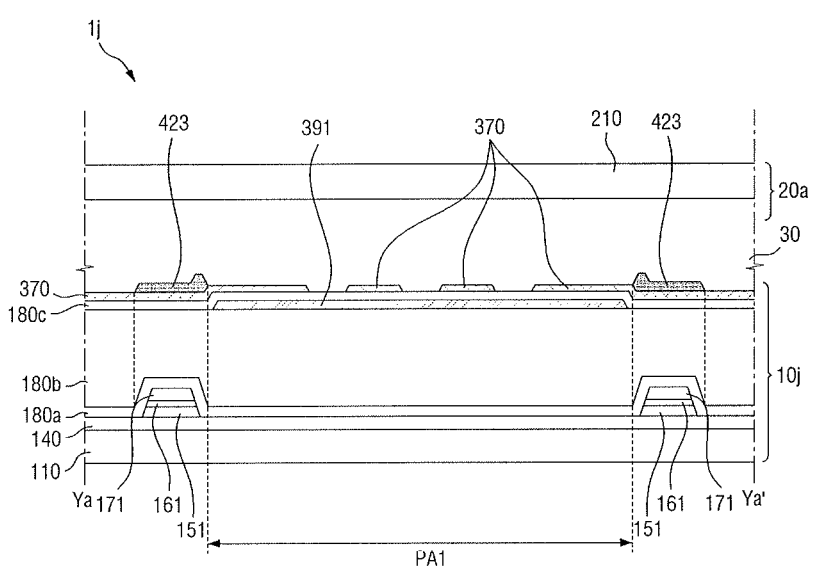
FIG. 49 illustrates a cross-sectional view, taken along line Ya-Ya' of FIG. 39, of the display device of FIG. 48.

FIG. 48 is a cross-sectional view, taken along line Xa-Xa' of FIG. 39, of a display device according to another exemplary embodiment of the present disclosure. FIG. 49 is a cross-sectional view, taken along line Ya-Ya' of FIG. 39, of the display device of FIG. 48.

Referring to FIGS. 48 and 49, a display device 1j may include an array substrate 10j, the opposite substrate 20a, and the liquid crystal layer 30. The display device 1j may also include the spacer member CS between the array substrate 10j and the opposite substrate 20a.

The display device 1j may be substantially identical, or similar, to the display device 1h that has been described above with reference to FIGS. 39 through 45 (particularly, the display device 1h of FIGS. 39 through 41) except that an auxiliary light-shielding member 423 is on the array substrate 10j. The electrical connection between the second electrode 370 and the voltage line 131 of the display device 1j in a peripheral area (CA of FIG. 1) may be substantially identical to that described above with reference to FIGS. 42 through 45.

The auxiliary light-shielding member 423 may be on the second electrode 370 and may overlap the data line 171. Other features of the auxiliary light-shielding member 423 and of the spacer member CS may be substantially identical, or similar, to those of the auxiliary light-shielding member 423 and of the spacer member CS of FIGS. 20 through 22, and thus, detailed descriptions thereof will not be repeated.

Figure 50:
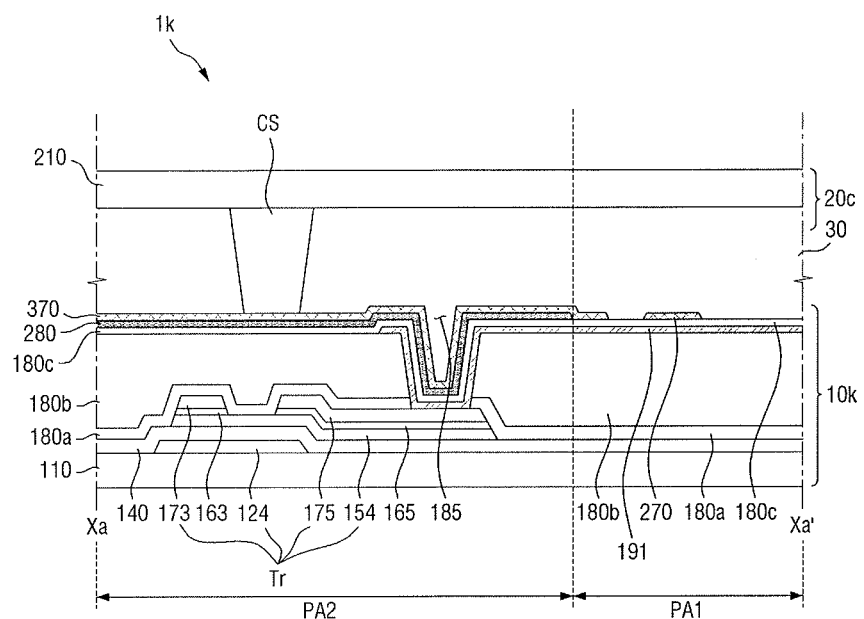
FIG. 50 illustrates a cross-sectional view, taken along line Xa-Xa' of FIG. 39, of a display device according to another exemplary embodiment of the present disclosure.
Figure 51:
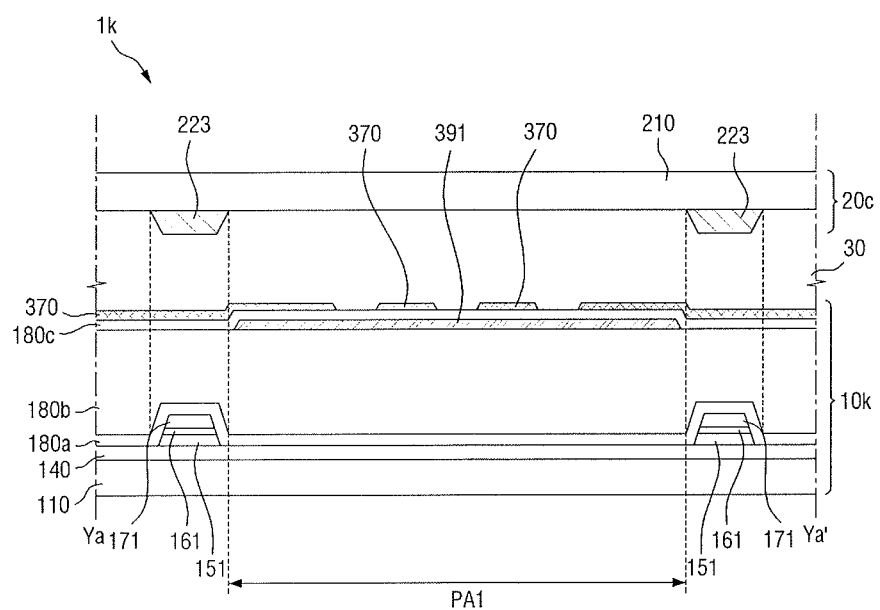
FIG. 51 illustrates a cross-sectional view, taken along line Ya-Ya' of FIG. 39, of the display device of FIG. 50.

FIG. 50 is a cross-sectional view, taken along line Xa-Xa' of FIG. 39, of a display device according to another exemplary embodiment of the present disclosure. FIG. 51 is a cross-sectional view, taken along line Ya-Ya' of FIG. 39, of the display device of FIG. 50.

Referring to FIGS. 50 and 51, a display device 1k may include an array substrate 10k, the opposite substrate 20a, and the liquid crystal layer 30. The display device 1k may also include the spacer member CS between the array substrate 10k and the opposite substrate 20a.

The display device 1k may be substantially identical, or similar, to the display device 1h that has been described above with reference to FIGS. 39 through 45 (particularly, the display device 1h of FIGS. 39 through 41) except that the light-shielding conductive layer 280 is below a second electrode 370. More specifically, the light-shielding conductive layer 280 may be below the second electrode 370, particularly, between the second electrode 370 and a second passivation layer 180c, and may directly contact the second electrode 370. The electrical connection between the second electrode 370 and a voltage line 131 of the display device 1k in a peripheral area (CA of FIG. 1) may be substantially identical to that described above with reference to FIGS. 42 through 45.

The structure of a peripheral area CA of the display device 1k will hereinafter be described with reference to FIGS. 52 through 55 and further reference to FIGS. 50 and 51, focusing mainly on the array substrate 10k.

Figure 52:
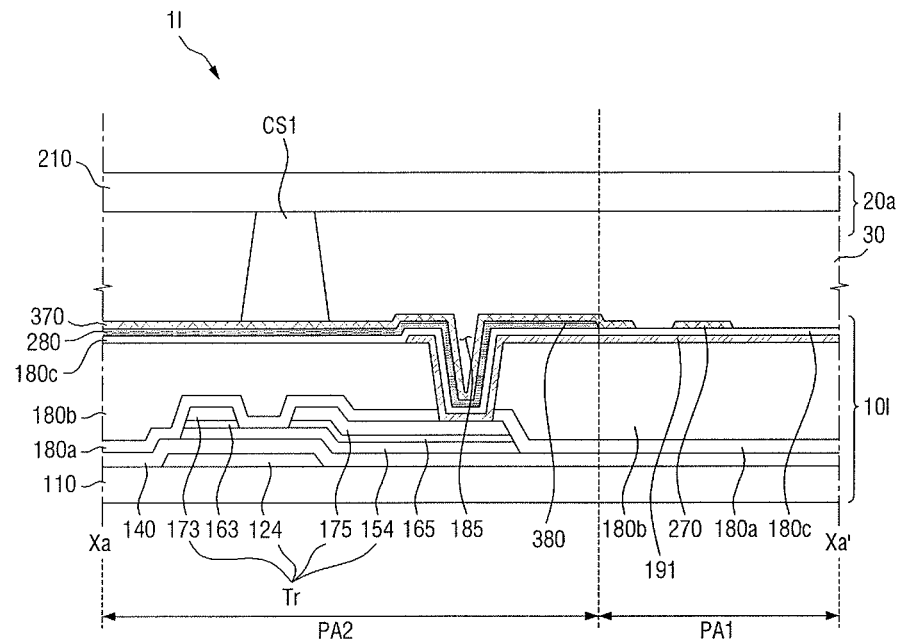
FIGS. 52 through 55 illustrate exemplary cross-sectional views, taken along line A-A' of FIG. 1, of the display device of FIGS. 50 and 51.

FIGS. 52 through 55 are exemplary cross-sectional views, taken along line A-A' of FIG. 1, of the display device of FIGS. 50 and 51. Referring to FIGS. 1 and 52, a voltage line 131 may be on the first base substrate 110 in the peripheral area CA.

The gate insulating layer 140, the first passivation layer 180a, the insulating layer 180b, and the second passivation layer 180c may include the external contact hole 187, which exposes the voltage line 131.

The connecting electrode 591 may be on the insulating layer 180b. The connecting electrode 591 may be electrically and physically connected to the voltage line 131 via the external contact hole 187. The connecting electrode 591 may be on the same layer and formed of the same material as the first electrode 391.

The second passivation layer 180c may be on the insulating layer 180b and may be at least partially removed to expose the connecting electrode 591.

The light-shielding conductive layer 280 and the second electrode 370 may be sequentially disposed on the insulating layer 180b and the second passivation layer 180c. The light-shielding conductive layer 280 may be electrically and physically connected to the connecting electrode 591. As a result, in response to the common voltage Vcom being applied to the voltage line 131, the common voltage Vcom may be provided to the second electrode 370 via the connecting electrode 591 and the light-shielding conductive layer 280.

Figure 53:
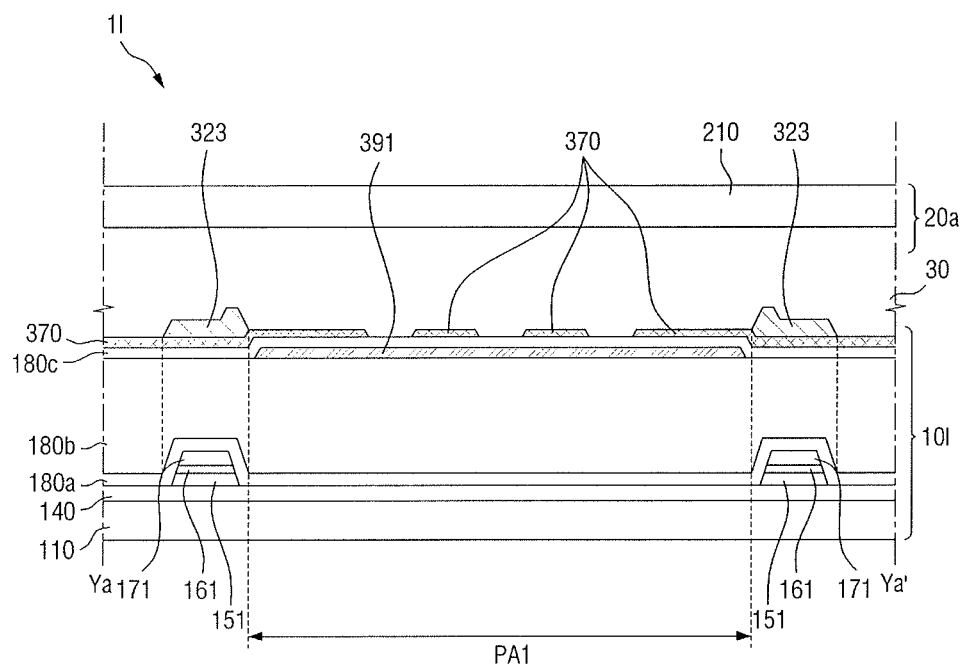

Alternatively, referring to FIGS. 1 and 53, the light-shielding conductive layer 280, unlike its counterpart of FIG. 52, may not be provided at least on the second passivation layer 180c in the peripheral area CA. The second electrode 370, which is on the light-shielding conductive layer 280, may be electrically and physically connected to the connecting electrode 591. As a result, in response to the common voltage Vcom being applied to the voltage line 131, the common voltage Vcom may be provided to the second electrode 370 via the connecting electrode 591.

Figure 54:
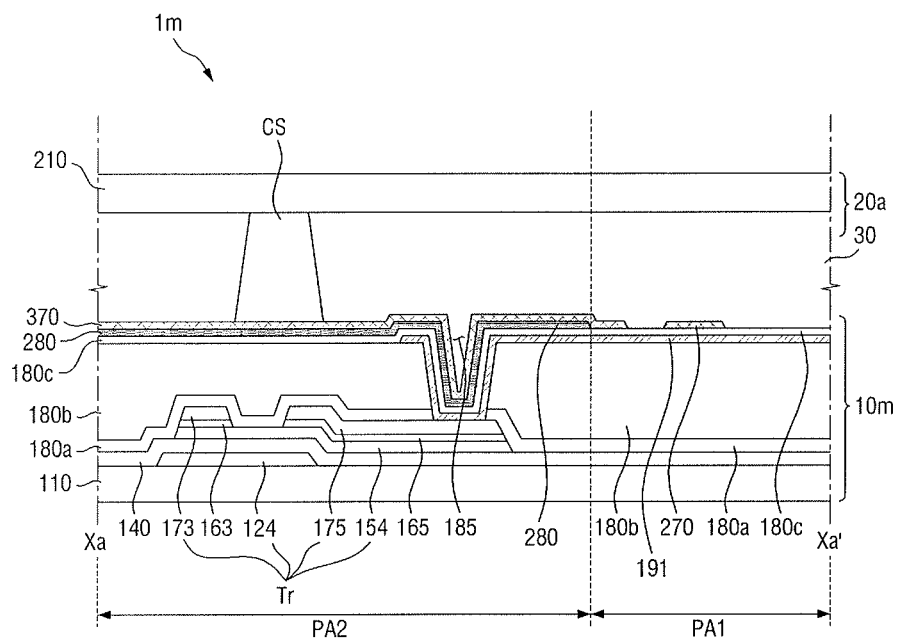

Alternatively, referring to FIGS. 1 and 54, the connecting electrode 591, unlike its counterpart of FIG. 52, may not be provided at all. For example, the second passivation layer 180c may be at least partially removed from around the external contact hole 187 to expose the voltage line 131, and the light-shielding conductive layer 280 may be physically and electrically connected to the voltage line 131 via the external contact hole 187.

Figure 55:
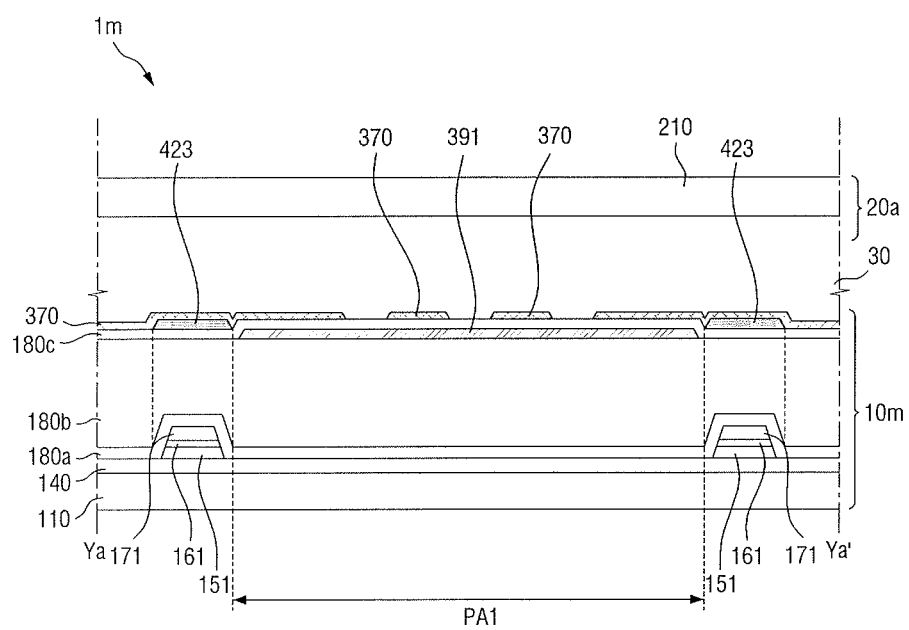

Alternatively, referring to FIGS. 1 and 55, the light-shielding conductive layer 280, unlike its counterpart of FIG. 52, may not be provided at least in the peripheral area CA. The second passivation layer 180c may be at least partially removed from around the external contact hole 187 to expose the voltage line 131, and the second electrode 370 may be physically and electrically connected to the voltage line 131 via the external contact hole 187.

Figure 56:
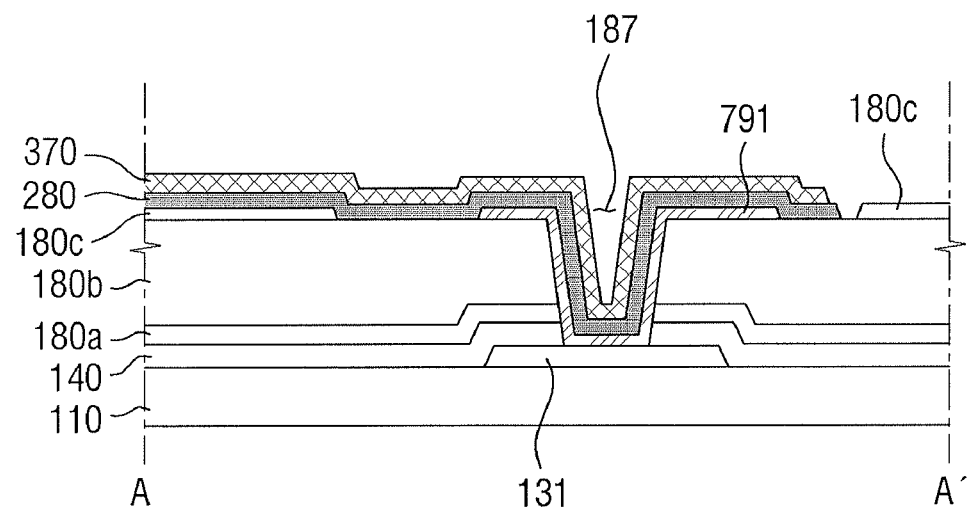
FIG. 56 illustrates a cross-sectional view, taken along line Xa-Xa' of FIG. 39, of a display device according to another exemplary embodiment of the present disclosure.
Figure 57:
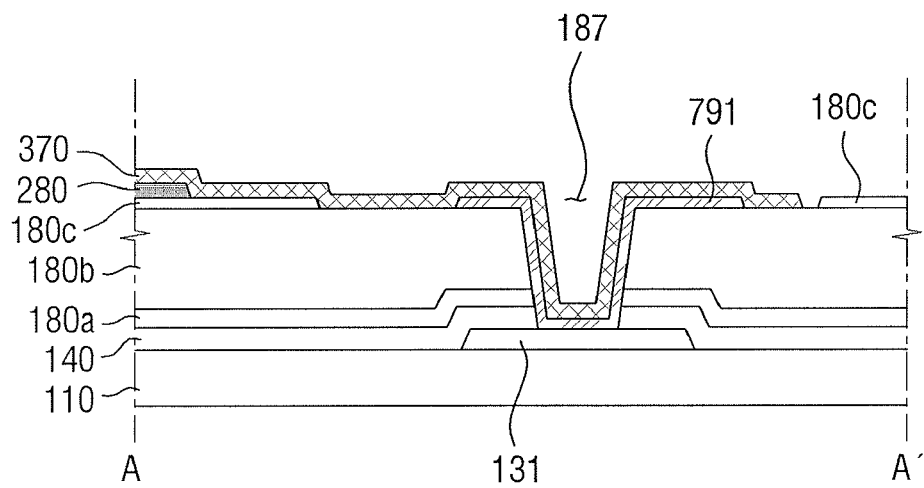
FIG. 57 illustrates a cross-sectional view, taken along line Ya-Ya' of FIG. 39, of the display device of FIG. 56.

FIG. 56 is a cross-sectional view, taken along line Xa-Xa' of FIG. 39, of a display device according to another exemplary embodiment of the present disclosure, and FIG. 57 is a cross-sectional view, taken along line Ya-Ya' of FIG. 39, of the display device of FIG. 56.

Referring to FIGS. 56 and 57, a display device 1l may include an array substrate 10l, the opposite substrate 20a, and the liquid crystal layer 30. The display device 1i may also include the spacer member CS1 between the array substrate 10i and the opposite substrate 20a.

The display device 1i may be substantially identical, or similar, to the display device 1h that has been described above with reference to FIGS. 39 through 45 (particularly, the display device 1h of FIGS. 39 through 41) except that an auxiliary light-shielding member 323 is disposed on the array substrate 10i. The electrical connection between a second electrode 370 and a voltage line 131 of the display device 1i in a peripheral area (CA of FIG. 1) may be substantially identical to that described above with reference to FIGS. 52 through 55. Other features of the auxiliary light-shielding member 323 and of the spacer member CS1 may be substantially identical, or similar, to those of the auxiliary light-shielding member 323 and of the spacer member CS1 of FIGS. 18 and 19, and thus, detailed descriptions thereof will not be repeated.

Figure 58:
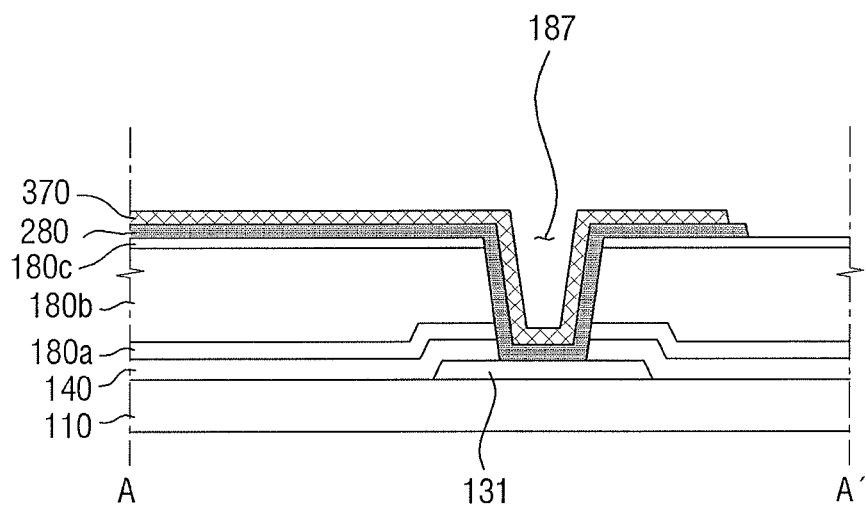
FIG. 58 illustrates a cross-sectional view, taken along line Xa-Xa' of FIG. 39, of a display device according to another exemplary embodiment of the present disclosure.
Figure 59:
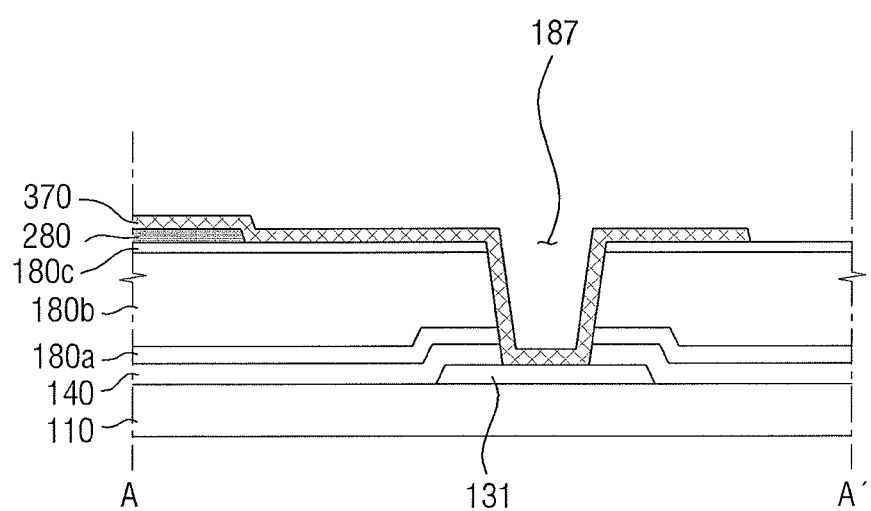
FIG. 59 illustrates a cross-sectional view, taken along line Ya-Ya' of FIG. 39, of the display device of FIG. 58.

FIG. 58 is a cross-sectional view, taken along line Xa-Xa' of FIG. 39, of a display device according to another exemplary embodiment of the present disclosure. FIG. 59 is a cross-sectional view, taken along line Ya-Ya' of FIG. 39, of the display device of FIG. 58.

Referring to FIGS. 58 and 59, a display device 1m may include an array substrate 10m, the opposite substrate 20a, and the liquid crystal layer 30. The display device 1j may also include the spacer member CS between the array substrate 10m and the opposite substrate 20a.

The display device 1m may be substantially identical, or similar, to the display device 1h that has been described above with reference to FIGS. 39 through 45 (particularly, the display device 1h of FIGS. 39 through 41) except that an auxiliary light-shielding member 423 is disposed on the array substrate 10j. The electrical connection between a second electrode 370 and a voltage line 131 of the display device 1j in a peripheral area (CA of FIG. 1) may be substantially identical to that described above with reference to FIGS. 52 through 55.

The auxiliary light-shielding member 423 may be disposed on the second electrode 370 and may overlap a data line 171. Other features of the auxiliary light-shielding member 423 and of the spacer member CS may be substantially identical, or similar, to those of the auxiliary light-shielding member 423 and of the spacer member CS of FIGS. 20 through 22, and thus, detailed descriptions thereof will not be repeated.

By way of summation and review, exemplary embodiments of the present disclosure provide a display device with improved transmissivity and aperture ratio.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a first base substrate;
   a gate line on the first base substrate and extending in a first direction;
   a data line on the first base substrate, insulated from the gate line, and extending in a second direction, which crosses the first direction;
   a switch on the first base substrate and electrically connected to the gate line and the data line;
   an insulating layer on the switch;
   a first electrode on the insulating layer;
   a light-shielding conductive layer directly on the first electrode and overlapping the switch
   an auxiliary light-shielding member extending in the second direction, the auxiliary light-shielding member directly on the first electrode and overlapping the data line; and
   a second electrode insulated from the first electrode and the light-shielding conductive layer, at least partially overlapping the first electrode, and electrically connected to the switch,
   wherein the auxiliary light-shielding member includes the same material as the light-shielding conductive layer.

2. The display device as claimed in claim 1, further comprising:
   a contact hole, which at least partially exposes the switch through the insulating layer;
   a first opening, which overlaps the contact hole, through the first electrode;
   a second opening, which overlaps the first opening, through the light-shielding conductive layer; and
   a light-shielding member, which overlaps the contact hole, the first opening, and the second opening.

3. The display device as claimed in claim 2, wherein the light-shielding member has an island-shaped planar shape and does not overlap the data line.

4. The display device as claimed in claim 2, wherein:
a maximum width, in the first direction, of the second opening is less than or equal to a maximum width, in the first direction, of the light-shielding member, and
a maximum width, in the second direction, of the second opening is less than or equal to a maximum width, in the second direction, of the light-shielding member.

5. The display device as claimed in claim 1, wherein the auxiliary light-shielding member is directly connected to the light-shielding conductive layer.

6. The display device as claimed in claim 2, wherein an inner side of the first opening and an inner side of the second opening are disposed substantially on a same line.

7. The display device as claimed in claim 2, wherein a distance between an inner side of the first opening and an inner side of the second opening is between 0 μm to 0.3 μm.

8. The display device as claimed in claim 1, wherein the light-shielding conductive layer includes a light-shielding metal layer that contacts the first electrode, and a transparent conductive material layer on the light-shielding metal layer.

9. The display device as claimed in claim 1, wherein the light-shielding conductive layer has a concentration gradient of a metal material and a transparent conductive material.

10. The display device as claimed in claim 1, further comprising:
a passivation layer on the light-shielding conductive layer; and
a spacer disposed on the passivation layer and overlapping the switch.

11. The display device as claimed in claim 10, wherein the spacer includes a light-shielding material.

12. The display device as claimed in claim 1, further comprising:
a voltage line on the first base substrate; and
a connecting electrode directly contacting the voltage line,
wherein the first electrode is electrically connected to the connecting electrode.

13. The display device as claimed in claim 12, wherein the connecting electrode includes the same material as the second electrode.

14. The display device as claimed in claim 1, further comprising:
a voltage line on the first base substrate,
wherein the first electrode directly contacts the voltage line.

15. The display device as claimed in claim 1, further comprising:
a voltage line on the first base substrate,
wherein the light-shielding conductive layer directly contacts the voltage line.

16. The display device as claimed in claim 1, wherein the light-shielding conductive layer and the second electrode do not overlap each other where they overlap the switch.

17. The display device as claimed in claim 1, further comprising a contact hole, which at least partially exposes the switch through the insulating layer, wherein the second electrode overlaps the switch only in the contact hole.

* * * * *